United States Patent
Yamazaki et al.

(10) Patent No.: US 10,488,757 B2
(45) Date of Patent: Nov. 26, 2019

(54) CONDUCTIVE COMPOSITION, ANTISTATIC FILM, LAMINATE AND PRODUCTION THEREFOR, AND PRODUCTION METHOD FOR PHOTOMASK

(71) Applicant: Mitsubishi Chemical Corporation, Tokyo (JP)

(72) Inventors: Akira Yamazaki, Toyohashi (JP); Masashi Uzawa, Toyohashi (JP); Hiroya Fukuda, Toyohashi (JP)

(73) Assignee: Mitsubishi Chemical Corporation, Tokyo (JP)

( * ) Notice: Subject to any disclaimer, the term of this patent is extended or adjusted under 35 U.S.C. 154(b) by 49 days.

(21) Appl. No.: 15/309,973

(22) PCT Filed: May 13, 2015

(86) PCT No.: PCT/JP2015/063767
§ 371 (c)(1),
(2) Date: Nov. 9, 2016

(87) PCT Pub. No.: WO2015/174453
PCT Pub. Date: Nov. 19, 2015

(65) Prior Publication Data
US 2017/0261854 A1 Sep. 14, 2017

(30) Foreign Application Priority Data
May 14, 2014 (JP) ................. 2014-100686

(51) Int. Cl.
| | | |
|---|---|---|
| *G03F 7/09* | (2006.01) | |
| *G03F 1/76* | (2012.01) | |
| *G03F 1/40* | (2012.01) | |
| *G03F 1/80* | (2012.01) | |
| *G03F 7/038* | (2006.01) | |
| *G03F 7/039* | (2006.01) | |
| *G03F 7/16* | (2006.01) | |
| *G03F 7/20* | (2006.01) | |
| *C08K 5/3432* | (2006.01) | |
| *C08G 73/00* | (2006.01) | |
| *C08L 101/06* | (2006.01) | |
| *C08L 101/14* | (2006.01) | |
| *C08L 29/04* | (2006.01) | |
| *C08L 79/02* | (2006.01) | |
| *G03F 7/32* | (2006.01) | |
| *B32B 27/18* | (2006.01) | |
| *C08L 79/00* | (2006.01) | |
| *H01B 1/12* | (2006.01) | |

(52) U.S. Cl.
CPC .............. *G03F 7/093* (2013.01); *B32B 27/18* (2013.01); *C08G 73/00* (2013.01); *C08K 5/3432* (2013.01); *C08L 29/04* (2013.01); *C08L 79/00* (2013.01); *C08L 79/02* (2013.01); *C08L 101/06* (2013.01); *C08L 101/14* (2013.01); *G03F 1/40* (2013.01); *G03F 1/76* (2013.01); *G03F 1/80* (2013.01); *G03F 7/038* (2013.01); *G03F 7/039* (2013.01); *G03F 7/094* (2013.01); *G03F 7/16* (2013.01); *G03F 7/2037* (2013.01); *G03F 7/2039* (2013.01); *G03F 7/2063* (2013.01); *G03F 7/322* (2013.01); *G03F 7/325* (2013.01); *H01B 1/12* (2013.01)

(58) Field of Classification Search
CPC .......... G03F 7/093; G03F 7/038; G03F 7/039; G03F 7/094; G03F 7/16; G03F 7/2037; G03F 7/2039; G03F 7/322; G03F 7/325; G03F 7/2063; G03F 1/76; G03F 1/80
USPC ....................................... 430/271.1
See application file for complete search history.

(56) References Cited

U.S. PATENT DOCUMENTS

| | | | |
|---|---|---|---|
| 5,614,336 A | 3/1997 | Mikami et al. | |
| 5,688,617 A | 11/1997 | Mikami et al. | |
| 7,666,326 B2 * | 2/2010 | Yoshida ................. | C08K 5/34 252/500 |
| 7,695,875 B2 * | 4/2010 | Touwslager .......... | G03F 7/0125 430/168 |
| 2006/0047030 A1 | 3/2006 | Yoshida et al. | |
| 2007/0181857 A1 | 8/2007 | Nishioka et al. | |
| 2010/0009296 A1 | 1/2010 | Kon | |
| 2013/0209667 A1 | 8/2013 | Yamada et al. | |
| 2015/0132537 A1 | 5/2015 | Fukuda et al. | |

FOREIGN PATENT DOCUMENTS

| | | |
|---|---|---|
| CN | 101696351 A | 4/2010 |
| CN | 103180365 A | 6/2013 |
| EP | 0 662 694 A2 | 7/1995 |
| EP | 0 844 284 A1 | 5/1998 |
| EP | 2 551 290 A1 | 1/2013 |
| JP | 7-196791 A | 8/1995 |

(Continued)

OTHER PUBLICATIONS

International Search Report dated Aug. 18, 2015 in PCT/JP2015/063767 filed May 13, 2015.

(Continued)

Primary Examiner — John S Chu
(74) Attorney, Agent, or Firm — Oblon, McClelland, Maier & Neustadt, L.L.P.

(57) ABSTRACT

This conductive composition includes: a conductive polymer (a) having a sulfonic acid group and/or a carboxy group; a basic compound (b) having at least one nitrogen-containing heterocyclic ring and an amino group; an aqueous polymer (c) having a hydroxyl group (excluding the conductive polymer (a)); a hydrophilic organic solvent (d); and water (e).

19 Claims, 2 Drawing Sheets

(56) References Cited

FOREIGN PATENT DOCUMENTS

| | | |
|---|---|---|
| JP | 2000-79662 A | 3/2000 |
| JP | 2000-219739 A | 8/2000 |
| JP | 2001-98069 A | 4/2001 |
| JP | 2002-57151 A | 2/2002 |
| JP | 2003-213148 A | 7/2003 |
| JP | 2006-96975 A | 4/2006 |
| JP | 2007-264118 A | 10/2007 |
| JP | 2010-67448 A | 3/2010 |
| JP | 2013-136759 A | 7/2013 |
| KR | 10-1992-0007112 A | 4/1992 |
| TW | 201349331 A | 12/2013 |
| WO | 97/07167 A1 | 2/1997 |
| WO | 2008-114411 A1 | 9/2008 |
| WO | 2014-017540 A1 | 1/2014 |
| WO | 2014/185522 A1 | 11/2014 |

OTHER PUBLICATIONS

Extended European Search Report dated Nov. 13, 2017 in Patent Application No. 15793021.5.
Office Action issued dated Jul. 17, 2017 in Korean Patent Application No. 10-2016-7032493 with unedited computer generated English translation Obtained by Global on dated Feb. 2, 2018, 17 pages.
Combined Chinese Office Action and Search Report dated Sep. 6, 2018 in Chinese Patent Application No. 201580038424.X (with English translation), 11 pages.
Combined Taiwanese Office Action and Search Report dated Nov. 8, 2018 in Taiwanese Patent Application No. 104115221 (with English translation), 20 pages.
European Office Action dated Mar. 26, 2019 in Patent Application No. 15 793 021.5, 7 pages.
Notice of Reasons for Refusal dated Sep. 10, 2019 issued in corresponding Japanese patent application No. 2015-527695 (with machine translation).

* cited by examiner

CONDUCTIVE COMPOSITION, ANTISTATIC FILM, LAMINATE AND PRODUCTION THEREFOR, AND PRODUCTION METHOD FOR PHOTOMASK

TECHNICAL FIELD

The present invention relates to a conductive composition, an antistatic film, a laminate and a method for producing the same, and a method for producing a photomask.

This application is based upon and claims the benefit of priority of the prior Japanese Patent Application No. 2014-100686 filed in Japan on May 14, 2014, the entire contents of which are incorporated herein by reference.

BACKGROUND ART

Various synthetic methods for producing a water-soluble conductive polymer having an acidic group such as a sulfonic acid group or a carboxyl group have been investigated since the water-soluble conductive polymer exhibits excellent solubility in water or an organic solvent by the hydrophilic action of its acidic group. For example, self-doping acidic group-substituted polyaniline which can exert conductivity without the addition of a doping agent thereto has been proposed. As a synthetic method thereof, a method for polymerizing an acid group-substituted aniline such as a sulfonic acid group-substituted aniline or a carboxyl group-substituted aniline by using an oxidizing agent in the presence of a basic reaction auxiliary has been proposed.

In addition, a great number of conductors including a conductive polymer film such as an antistatic film containing a water-soluble conductive polymer having an acidic group as a main component or production methods thereof have been reported (for example, see Patent Literature 1).

However, a water-soluble conductive polymer having an acidic group exhibits solubility in water, and thus a conductive polymer film such as an antistatic film formed from this exhibits insufficient water resistance. Hence, a conductor including an antistatic film is not suitable for an application requiring water resistance so that there is a restriction on the application thereof. For the purpose of imparting water resistance to an antistatic film, although a method for blending a high molecular compound with a water-soluble conductive polymer having an acidic group has also been proposed, the desired water resistance is not necessarily satisfied.

As a method for solving the problem related to water resistance, a conductive composition containing a water-soluble conductive polymer having a sulfonic acid group and/or a carboxylic acid group and a compound (hereinafter, referred to as the crosslinking compound in some cases) having at least two functional groups which can react with the sulfonic acid group and/or the carboxylic acid group in the water-soluble conductive polymer has been proposed (for example, see Patent Literature 2). According to this conductive composition, it is possible to form a conductor exhibiting water resistance and acetone resistance by heating a composition to which a crosslinking compound such as polyvinyl alcohol is added at 100° C. or higher.

In addition, a method for insolubilizing a water-soluble conductive polymer having a sulfonic acid group and/or a carboxylic acid group by heating it at a high temperature of 150° C. or higher has been proposed (for example, see Patent Literature 3).

In addition, a conductive composition containing a thickener, an organic solvent to dissolve or disperse a water-soluble conductive polymer, and water in addition to the water-soluble conductive polymer having a sulfonic acid group and/or a carboxylic acid group and a compound having at least two functional groups which can react with the sulfonic acid group and/or the carboxylic acid group in the water-soluble conductive polymer has been proposed (for example, see Patent Literature 4). According to this conductive composition, sagging on the substrate hardly occurs and a conductive composition layer exhibiting excellent drying property can be formed. Furthermore, a conductor in which cissing on the substrate is prevented can be formed as the coating property of the conductive composition to a substrate is improved by blending a surfactant.

CITATION LIST

Patent Documents

Patent Document 1: JP 7-196791 A
Patent Document 2: WO 97/07167 A
Patent Document 3: JP 2001-98069 A
Patent Document 4: JP 2003-213148 A

DISCLOSURE OF INVENTION

Problem to be Solved by the Invention

The conductive polymer films such as an antistatic film containing a water-soluble conductive polymer as a main component described in Patent Literatures 1 to 4 exhibit excellent resistance to a particular solvent or adhesive property to a particular substrate.

However, these antistatic films do not necessarily exhibit satisfactory resistance to an alkaline solution which is required in the case of being used as a lower layer film of the resist layer or satisfactory adhesive property to a substrate such as a glass substrate or a tantalum substrate to be widely used in the electronic field or the like.

The invention has been made in view of the above circumstances, and an object thereof is to provide a conductive composition which can be formed into an antistatic film exhibiting excellent resistance to a solvent such as water or an alkaline solution and excellent adhesive property to a substrate such as a glass substrate or a tantalum substrate, an antistatic film formed from the conductive composition, a laminate including the antistatic film and a method for producing the same, and a method for producing a photomask.

Means to Solve the Problems

The invention has the following aspects.

[1] A conductive composition including a conductive polymer (a) having a sulfonic acid group and/or a carboxyl group, a basic compound (b) having at least one nitrogen-containing heterocyclic ring and one amino group, a water-soluble polymer (c) having a hydroxyl group (provided that the conductive polymer (a) is excluded), a hydrophilic organic solvent (d), and water (e).

[2] The conductive composition according to [1], in which the basic compound (b) has a conjugated structure.

[3] The conductive composition according to [1] or [2], in which the nitrogen-containing heterocyclic ring is a pyridine ring.

[4] The conductive composition according to any one of [1] to [3], in which the water-soluble polymer (c) is polyvinyl alcohol.

[5] The conductive composition according to [4], in which a saponification degree of the polyvinyl alcohol is 85% or more.

[6] The conductive composition according to any one of [1] to [5], in which the hydrophilic organic solvent (d) is a monohydric alcohol having from 1 to 3 carbon atoms.

[7] The conductive composition according to any one of [1] to [6], in which a content of the hydrophilic organic solvent (d) is from 1 to 15% by mass with respect to a total mass of the conductive composition.

[8] The conductive composition according to any one of [1] to [7], in which the conductive polymer (a) has a unit represented by the following general formula (1):

[Chem. 1]

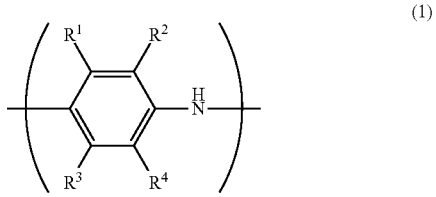

in the formula (1), $R^1$ to $R^4$ each independently represent a hydrogen atom, a linear or branched alkyl group having from 1 to 24 carbon atoms, a linear or branched alkoxy group having from 1 to 24 carbon atoms, an acidic group, a hydroxyl group, a nitro group, or a halogen atom, and at least one of $R^1$ to $R^4$ is an acidic group, wherein the acidic group is a sulfonic acid group or a carboxyl group.

[9] An antistatic film formed from the conductive composition according to any one of [1] to [8], in which the antistatic film has a maximum value of absorption in a wavelength region of from 450 to 500 nm in the ultraviolet and visible absorption spectrum at from 350 to 900 nm.

[10] A laminate including a substrate and an antistatic film formed on at least one surface of the substrate from the conductive composition according to any one of [1] to [8], in which the antistatic film has a maximum value of absorption in a wavelength region of from 450 to 500 nm in the ultraviolet and visible absorption spectrum at from 350 to 900 nm.

[11] The laminate according to [10], further including a resist layer on the antistatic film.

[12] The laminate according to [11], further including a conductive layer on the resist layer.

[13] The laminate according to any one of [10] to [12], in which a surface roughness (Ra) of an outermost layer on the antistatic film side is 1.5 nm or less.

[14] A method for producing a laminate, the method including forming an antistatic film by coating or impregnating the conductive composition according to any one of [1] to [8] on at least one surface of a substrate and then subjecting the conductive composition to a heat treatment at 80° C. or higher.

[15] The production method according to [14], further including forming a resist layer on the antistatic film.

[16] The production method according to [15], further including forming a conductive layer on the resist layer.

[17] A method for producing a photomask, the method including:
forming an antistatic film by coating or impregnating the conductive composition according to any one of [1] to [8] on at least one surface of a substrate and then subjecting the conductive composition to a heat treatment at 80° C. or higher;
forming a resist layer on the antistatic film;
performing pattern drawing by irradiating a surface of the resist layer with ionizing radiation;
forming a resist pattern by developing the resist layer after pattern drawing;
etching the antistatic film by using the resist pattern as a mask; and
removing the resist pattern remaining on the substrate after etching.

[18] A method for producing a photomask, the method including:
forming an antistatic film by coating or impregnating the conductive composition according to any one of [1] to [8] on at least one surface of a substrate and then subjecting the conductive composition to a heat treatment at 80° C. or higher;
forming a resist layer on the antistatic film;
forming a conductive layer on the resist layer;
performing pattern drawing by irradiating a surface of the resist layer with ionizing radiation from a conductive layer side;
forming a resist pattern by removing the conductive layer and developing the resist layer after pattern drawing;
etching the antistatic film by using the resist pattern as a mask; and
removing the resist pattern remaining on the substrate after etching. [19] The production method according to [17] or [18], in which the substrate has a light shielding layer on a side of an interface between the substrate and the antistatic film and the etching step further includes etching the light shielding layer.

Effect of the Invention

According to the invention, it is possible to provide a conductive composition which can be formed into an antistatic film exhibiting excellent resistance to a solvent such as water or an alkaline solution and excellent adhesive property to a substrate such as a glass substrate or a tantalum substrate, an antistatic film formed from the conductive composition, a laminate including the antistatic film and a method for producing the same, and a method for producing a photomask.

EMBODIMENTS FOR CARRYING OUT THE INVENTION

Figure 1:
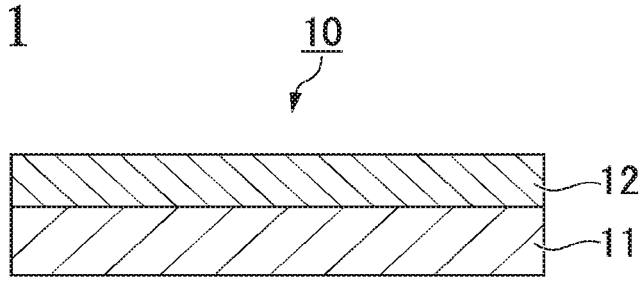
FIG. 1 is a cross-sectional diagram illustrating an example of the laminate of the first aspect of the invention.

Hereinafter, the invention will be described in detail.
Incidentally, the term "conductive" in the invention is to have a surface resistance value of $10^{10}\Omega$ or less. The surface resistance value is measured by a two-terminal method (interelectronic distance: 20 mm) using a resistivity meter.

In addition, the terms "water soluble" and "soluble" in the invention mean that 0.1 g or more of a substance uniformly dissolves in 10 g (liquid temperature: 25° C.) of any of (i) water, (ii) water containing a base and/or a basic salt, (iii) water containing an acid, or (iv) a mixture of water and a water-soluble organic solvent.

In addition, the coating film formed from the conductive composition of the invention is also referred to as the "antistatic film".

"Conductive Composition"

The conductive composition of the invention contains a conductive polymer (a) having a sulfonic acid group and/or a carboxyl group, a basic compound (b) having at least one nitrogen-containing heterocyclic ring and one amino group, a water-soluble polymer (c) having a hydroxyl group (provided that the conductive polymer (a) is excluded), a hydrophilic organic solvent (d), and water (e).

<Conductive Polymer (a)>

The conductive polymer (a) has a sulfonic acid group and/or a carboxyl group (hereinafter, the sulfonic acid group and/or the carboxyl group are also collectively referred to as the "acidic group"). Here, the sulfonic acid group and/or the carboxyl group refer to at least one of the sulfonic acid group and the carboxyl group.

The conductive polymer (a) is not particularly limited as long as it is a high molecular compound having a sulfonic acid group and/or a carboxyl group, and a known conductive polymer can be used.

Specific examples thereof may include a conductive polymer having a sulfonic acid group and/or a carboxyl group, an alkyl group substituted with a sulfonic acid group and/or a carboxyl group, or an alkyl group containing an ether bond in the backbone of at least one kind of π-conjugated conductive polymer selected from the group consisting of unsubstituted or substituted polyphenylene vinylene, polyacetylene, polythiophene, polypyrrole, polyaniline, polyisothianaphthene, polyfuran, polycarbazole, polydiaminoanthraquinone, and polyindole or on the nitrogen atom in the π-conjugated conductive polymer, and an alkali metal salt, an ammonium salt, and a substituted ammonium salt of this.

Among these, a conductive polymer containing any of a polythiophene, polypyrrole, polyaniline, polyphenylene vinylene, or polyisothianaphthene backbone is preferable from the viewpoint of exhibiting excellent conductivity.

A conductive polymer containing one or more kinds of units selected from the group consisting of units represented by the following general formulas (2) to (4) at from 20 to 100 mol % with respect to the mol number (100 mol %) of the entire units constituting the conductive polymer is preferable particularly from the viewpoint of being able to exert high conductivity.

[Chem. 2]

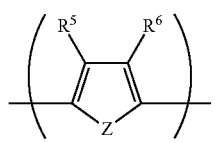

(2)

[Chem. 3]

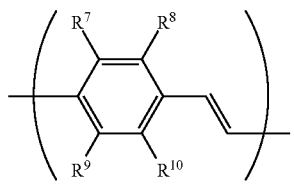

(3)

[Chem. 4]

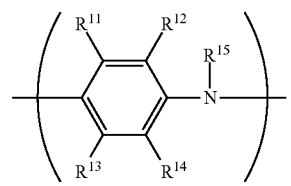

(4)

In the formulas (2) to (4), Z represents a sulfur atom or a nitrogen atom, and $R^5$ to $R^{15}$ each independently represent a hydrogen atom, a linear or branched alkyl group having from 1 to 24 carbon atoms, a linear or branched alkoxy group having from 1 to 24 carbon atoms, an acidic group, a hydroxyl group, a nitro group, a halogen atom, —$N(R^{16})_2$, —$NHCOR^{16}$, —$SR^{16}$, —$OCOR^{16}$, —$COOR^{16}$, —$COR^{16}$, —CHO, or —CN, in which $R^{16}$ represents a linear or branched alkyl group having from 1 to 24 carbon atoms, an aryl group, or an aralkyl group.

Provided that at least either of $R^5$ or $R^6$ in the formula (2), at least one of $R^7$ to $R^{10}$ in the formula (3), and at least one of $R^{11}$ to $R^{15}$ in the formula (4) are an acidic group, respectively.

Here, the "acidic group" refers to a sulfonic acid group (—$SO_3H$) or a carboxyl group (—COOH).

Incidentally, the sulfonic acid group also includes a substituent (—$R^{17}SO_3H$) having a sulfonic acid group, and it may form a salt of an alkali metal, ammonium, substituted ammonium, or the like.

Meanwhile, the carboxyl group also includes a substituent (—$R^{17}COOH$) having a carboxyl group, and it may form a salt of an alkali metal, ammonium, substituted ammonium, or the like.

$R^{17}$ represents a linear or branched alkylene group having from 1 to 24 carbon atoms, an arylene group, or an aralkylene group.

Examples of the alkyl group may include a methyl group, an ethyl group, a n-propyl group, an iso-propyl group, a n-butyl group, an iso-butyl group, a sec-butyl group, a tert-butyl group, a dodecyl group, and a tetracosyl group.

Examples of the alkoxy group may include a methoxy group, an ethoxy group, a n-propoxy group, an iso-propoxy group, a n-butoxy group, an iso-butoxy group, a sec-butoxy group, a tert-butoxy group, a heptoxy group, a hexoxy group, an octoxy group, a dodecoxy group, and a tetracoxy group.

Examples of the halogen atom may include a fluorine atom, a chlorine atom, a bromine atom, and an iodine atom.

Examples of the aryl group may include a phenyl group, a naphthyl group, a tolyl group, and a xylyl group.

Examples of the aralkyl group may include a benzyl group and a phenethyl group.

Examples of the alkylene group may include a methylene group, an ethylene group, a n-propylene group, an iso-propylene group, a n-butylene group, an iso-butylene group, a sec-butylene group, and a tert-butylene group.

Examples of the arylene group may include a phenylene group and a naphthylene group.

Examples of the aralkylene group may include a benzylene group and a phenethylene group.

As the conductive polymer (a), a compound having a unit represented by the general formula (4) is preferable from the viewpoint of being able to exert high conductivity, and among them, a compound having a unit represented by the following general formula (1) is preferable particularly from the viewpoint of exhibiting excellent solubility as well.

[Chem. 5]

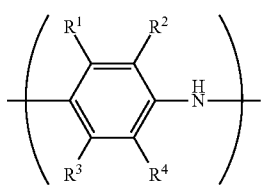

In the formula (1), $R^1$ to $R^4$ each independently represent a hydrogen atom, a linear or branched alkyl group having from 1 to 24 carbon atoms, a linear or branched alkoxy group having from 1 to 24 carbon atoms, an acidic group, a hydroxyl group, a nitro group, or a halogen atom, and at least one of $R^1$ to $R^4$ is an acidic group. A sulfonic acid group is preferable as the acidic group from the viewpoint of being able to exert higher conductivity.

As the unit represented by the general formula (1), those in which any one of $R^1$ to $R^4$ is a linear or branched alkoxy group having from 1 to 4 carbon atoms, any one of the others is a sulfonic acid group, and the remainders are a hydrogen atom are preferable from the viewpoint of ease of production.

The conductive polymer (a) contains the unit represented by the general formula (1) preferably at from 10 to 100 mol %, more preferably at from 50 to 100 mol %, and even more preferably at 100 mol % with respect to the mol number (100 mol %) of the entire units constituting the conductive polymer (a) from the viewpoint of exhibiting excellent solubility in water and an organic solvent regardless of the pH.

In addition, it is preferable that the conductive polymer (a) contains the unit represented by the general formula (1) by 10 or more in one molecule from the viewpoint of exhibiting excellent conductivity.

In addition, in the conductive polymer (a), the content of acidic group is preferably 70 mol % or more, more preferably 80 mol % or more, and even more preferably 90 mol % or more with respect to the mol number of the entire aromatic rings from the viewpoint of improving the solubility. In addition, the content is preferably 100 mol % or less.

Furthermore, the conductive polymer (a) may contain one or more kinds of units selected from the group consisting of a substituted or unsubstituted anilinediyl, thiophenediyl, pyrrolediyl, phenylene, vinylene, a divalent unsaturated group, and a divalent saturated group as a constituent unit other than the unit represented by the general formula (1) as long as the solubility, the conductivity, and the like are not adversely affected.

As the conductive polymer (a), a compound having a structure represented by the following general formula (5) is preferable from the viewpoint of being able to exert high conductivity and solubility.

[Chem. 6]

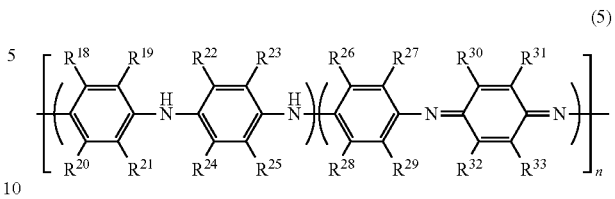

In the formula (5), $R^{18}$ to $R^{33}$ each independently represent a hydrogen atom, a linear or branched alkyl group having from 1 to 24 carbon atoms, a linear or branched alkoxy group having from 1 to 24 carbon atoms, an acidic group, a hydroxyl group, a nitro group, or a halogen atom, and at least one of $R^{18}$ to $R^{33}$ is an acidic group. In addition, n represents the polymerization degree, and it is an integer 5 or more.

Among the compounds having the structure represented by the general formula (5), poly(2-sulfo-5-methoxy-1,4-iminophenylene) is even more preferable from the viewpoint of exhibiting excellent solubility.

The mass average molecular weight of the conductive polymer (a) is preferably from 3,000 to 1,000,000, more preferably from 5,000 to 80000, and even more preferably from 5,000 to 70000 from the viewpoint of conductivity.

Here, the mass average molecular weight of the conductive polymer (a) is a mass average molecular weight (in terms of sodium polystyrene sulfonate) measured by gel permeation chromatography (GPC).

The content of the conductive polymer (a) is preferably from 0.01 to 15% by mass and more preferably from 0.1 to 10% by mass with respect to the total mass of the conductive composition. Sufficient conductivity can be exerted when the content of the conductive polymer (a) is 0.01% by mass or more. Meanwhile, a coating film exhibiting favorable smoothness can be formed when the content of the conductive polymer (a) is 15% by mass or less.

(Method for Producing Conductive Polymer (a))

The conductive polymer (a) can be produced by a known method. For example, it is obtained by polymerizing acidic group-substituted aniline or an alkali metal salt, ammonium salt, or substituted ammonium salt thereof by using an oxidizing agent in the presence of a basic reaction auxiliary.

Examples of the acidic group-substituted aniline may include sulfonic acid group-substituted aniline having a sulfonic acid group as the acidic group.

Typical sulfonic acid group-substituted aniline is an aminobenzenesulfonic acid, and specifically o-, m-, or p-aminobenzenesulfonic acid, aniline-2,6-disulfonic acid, aniline-2,5-disulfonic acid, aniline-3,5-disulfonic acid, aniline-2,4-disulfonic acid, and aniline-3,4-disulfonic acid are preferably used.

Examples of sulfonic acid group-substituted anilines other than the aminobenzenesulfonic acid may include an alkyl group-substituted aminobenzenesulfonic acid such as methyl(amino)benzenesulfonic acid, ethyl(amino)benzene sulfonic acid, n-propyl(amino)benzenesulfonic acid, isopropyl(amino)benzenesulfonic acid, n-butyl(amino)benzenesulfonic acid, sec-butyl(amino)benzenesulfonic acid, or t-butyl(amino)benzenesulfonic acid; an alkoxy group-substituted aminobenzenesulfonic acid such as methoxy(amino) benzenesulfonic acid, ethoxy(amino)benzenesulfonic acid, or propoxy(amino)benzenesulfonic acid; a hydroxyl group-substituted aminobenzenesulfonic acid; a nitro group-substituted aminobenzenesulfonic acid; and a halogen-substituted aminobenzenesulfonic acid such as fluoroaminobenzenesulfonic acid, chloroaminobenzenesulfonic acid, or bromincaminobenzencsulfonic acid.

Among these, an alkyl group-substituted aminobenzenesulfonic acid, alkoxy group-substituted aminobenzenesulfonic acid, a hydroxyl group-substituted aminobenzenesulfonic acid, or a halogen-substituted aminobenzenesulfonic acid is preferable from the viewpoint of obtaining a conductive polymer (a) particularly exhibiting excellent conductivity and solubility, and an alkoxy-substituted aminobenzenesulfonic acid and an alkali metal salt, ammonium salt, or substituted ammonium salt thereof are more preferable and 2-amino-4-methoxybenzenesulfonic acid and 3-amino-4-methoxybenzenesulfonic acid are even more preferable from the viewpoint of ease of production.

These respective sulfonic acid group-substituted anilines may be used singly, or two or more kinds thereof may be used by being mixed in an arbitrary proportion.

As the basic reaction auxiliary to be used in the production of the conductive polymer (a), for example, an inorganic base, ammonia, a cycloaliphatic amine, a cyclic saturated amine, and a cyclic unsaturated amine are used.

An inorganic base is preferable as the basic reaction auxiliary, and specific examples thereof may include sodium hydroxide, potassium hydroxide, and lithium hydroxide.

In addition, a cycloaliphatic amine such as methylamine, dimethylamine, trimethylamine, ethylamine, diethylamine, triethylamine, ethylmethylamine, ethyldimethylamine, or diethylmethylamine; and a cyclic unsaturated amine such as pyridine, α-picoline, β-picoline, or γ-picoline are preferably used as the basic reaction auxiliary other than the inorganic base.

These respective basic reaction auxiliaries may be used singly, or two or more kinds thereof may be used by being mixed in an arbitrary proportion.

The oxidizing agent to be used in the production of the conductive polymer (a) is not limited as long as it is an oxidizing agent having a standard electrode potential of 0.6 V or more, but it is preferable to use, for example, a peroxodisulfuric acid such as peroxodisulfuric acid, ammonium peroxodisulfate, sodium peroxodisulfate, or potassium peroxodisulfate; and hydrogen peroxide.

These respective oxidizing agents may be used singly, or two or more kinds thereof may be used by being mixed in an arbitrary proportion.

Examples of the polymerization method may include a method for adding dropwise a mixed solution of a monomer with a basic reaction auxiliary into an oxidizing agent solution, a method for adding dropwise an oxidizing agent solution into a mixed solution of a monomer with a basic reaction auxiliary, and a method for adding dropwise a mixed solution of a monomer with a basic reaction auxiliary and an oxidizing agent solution into a reaction vessel at the same time.

The reaction time is preferably from 1 minute to 5 hours.
The reaction temperature is preferably from −15 to 60° C.
Examples of the solvent to be used in the polymerization may include water or a mixed solvent of water and a water-soluble organic solvent. The water-soluble organic solvent is not limited as long as it is mixed with water, and examples thereof may include an alcohol such as methanol, ethanol, n-propyl alcohol, isopropyl alcohol, n-butanol, isobutanol, 2-butanol, 3-butanol, t-butanol, 1-pentanol, 3-methyl-1-butanol, 2-pentanol, n-hexanol, 4-methyl-2-pentanol, 2-ethylbutanol, benzyl alcohol, furfuryl alcohol, or tetrahydrofurfuryl alcohol, a polyhydric alcohol derivative such as ethylene glycol monomethyl ether, ethylene glycol monoethyl ether, methoxymethoxyethanol, propylene glycol monoethyl ether, or glyceryl monoacetate, acetone, acetonitrile, dimethylformamide, and dimethylacetamide.

Incidentally, the mixing ratio of water and a water-soluble organic solvent is arbitrary in the case of using a mixed solvent as the solvent, but it is preferably water:water-soluble organic solvent=1:100 to 100:1.

After the polymerization, the solvent is usually filtered off by using a centrifugal separator or the like. Furthermore, the filtered product is washed with a cleaning liquid and dried if necessary to obtain a polymer (conductive polymer (a)).

In the conductive polymer (a) thus obtained, a oligomer produced by a side reaction, an acidic substance (the residual monomer, a sulfate ion of a decomposition product of the oxidizing agent, or the like), a basic substance (the basic reaction auxiliary, an ammonium ion of a decomposition product of the oxidizing agent, or the like), and the like are contained in some cases, and these may be a factor to inhibit the conductivity.

Hence, it is preferable to remove the oligomer, the acidic substances, the basic substances, and the like by purifying the conductive polymer (a). The conductivity is further improved by removing these.

The purification method of the conductive polymer (a) is not particularly limited, and it is possible to use any method such as an ion exchange method, an acid washing in a protonic acid solution, removal by a heat treatment, or neutralization precipitation, and in particular, an ion exchange method is effective.

By using the ion exchange method, it is possible to effectively remove a basic substance present in the state of a salt formed with the acidic group in the conductive polymer, an acidic substance, and the like and to obtain a conductive polymer (a) having a high purity Examples of the ion exchange method may include a column type or batch type treatment using an ion exchange resin such as a cation exchange resin or an anion exchange resin; and electrodialysis.

Incidentally, in the case of removing an acidic substance, a basic substance, or the like by the ion exchange method, the reaction mixture obtained by the polymerization is dissolved in an aqueous medium to prepare a reaction mixture solution having a desired concentration, and the acidic substance, the basic substance, or the like is then removed.

Examples of the aqueous medium may include water, a water-soluble organic solvent, and a mixed solvent of water and a water-soluble organic solvent. A water-soluble organic solvent is an organic solvent soluble in water, and examples thereof may include an alcohol such as methanol, ethanol, isopropyl alcohol, n-propyl alcohol, or 1-butanol; a ketone such as acetone, methyl ethyl ketone, ethyl isobutyl ketone, or methyl isobutyl ketone; an ethylene glycol such as ethylene glycol, ethylene glycol methyl ether, or ethylene glycol mono-n-propyl ether; a propylene glycol such as propylene glycol, propylene glycol methyl ether, propylene glycol ethyl ether, propylene glycol butyl ether, or propylene glycol propyl ether; an amide such as dimethylformamide or dimethylacetamide; a pyrrolidone such as N-methylpyrrolidone or N-ethyl-pyrrolidone; a hydroxy ester such as methyl lactate, ethyl lactate, methyl β-methoxyisobutyrate or methyl α-hydroxyisobutyrate.

In the case of the ion exchange method using an ion exchange resin, the amount of the sample solution with respect to the ion exchange resin is a volume to be preferably 10-fold and more preferably 5-fold the ion exchange resin, for example, in the case of a reaction mixture solution having a concentration of 5% by mass. Examples of the cation exchange resin may include the "Amberlite IR-120B" manufactured by ORGANO CORPORATION. Examples of the anion exchange resin may include the "Amberlite IRA410" manufactured by ORGANO CORPORATION.

In the case of electrodialysis, the ion exchange membrane for electrodialysis is not particularly limited, but it is preferable to use those that are an ion exchange membrane subjected to a treatment so that a monovalent ion selectively permeates therethrough and have a molecular weight cutoff of 300 or less in order to further suppress the penetration of an impurity by diffusion. As such an ion exchange membrane, for example, the "NEOSEPTA CMK (cation exchange membrane, molecular weight cutoff of 300)" and the "NEOSEPTA AMX (anion exchange membrane, molecular weight cutoff of 300)" manufactured by ASTOM Corporation are suitable. In addition, as the ion exchange membrane to be used in the electrodialysis, a bipolar membrane of an ion exchange membrane having a structure in which an anion exchange layer and a cation exchange layer are bound together may be used. As such a bipolar membrane, for example, the "PB-1E/CMB" manufactured by ASTOM Corporation is suitable. The current density in electrodialysis is preferably the critical current density or less. The voltage applied to a bipolar membrane is preferably from 10 to 50 V and more preferably from 25 to 35 V.

The conductive polymer (a) purified in this manner exhibit superior conductivity since the oligomer, the acidic substance (particularly the residual monomer, a sulfate ion of a decomposition product of the oxidizing agent, or the like), the basic substance (the basic reaction auxiliary, an ammonium ion of a decomposition product of the oxidizing agent, or the like), and the like are sufficiently removed therefrom. In addition, for example, when an antistatic film is formed as the lower layer of the resist layer by using the conductive composition of the present embodiment, the migration of the acidic substance or the basic substance to the resist layer side is likely to be suppressed so that the thereof or the basic substance on the resist layer can be further decreased.

Incidentally, the conductive polymer (a) after the purification is in a state of being dispersed or dissolved in an aqueous medium such as water. Hence, a solid conductive polymer (a) is obtained when the aqueous medium is all removed therefrom by using an evaporator or the like, but the conductive polymer (a) may be used in the production of the conductive composition as it is in a state of being dispersed or dissolved in a solvent.

<Basic Compound (b)>

The basic compound (b) has at least one nitrogen-containing heterocyclic ring and one amino group. When the basic compound (b) is used, it is considered that a cross-linking state is formed as a plurality of base sites in the molecule of the basic compound (b) efficiently act to the acidic group in the conductive polymer (a), and as a result, the resistance to a solvent such as water or an alkaline solution (hereinafter, referred to as the "solvent resistance") is improved. Moreover, the adhesive property to a substrate such as a glass substrate or a tantalum substrate (hereinafter, referred to as the "adhesive property to a substrate") is also improved.

As the basic compound (b), a compound having a conjugated structure is more preferable. The basic compound (b) can efficiently interact with the conductive polymer (a) when it is a compound having a conjugated structure. As the basic compound (b), those having at least one pyridine ring and one amino group is preferable, and those having a boiling point of 120° C. or higher are more preferable from the viewpoint of the diffusion of the basic compound (b), and those in which at least one hydrogen atom in the pyridine ring is substituted with an amino group are even more preferable.

Specific examples of the basic compound (b) may include a heterocyclic compound having one amino group, such as 2-aminopyridine, 4-aminopyridine, 4-dimethylaminopyridine, 4-dimethylaminomethylpyridine, 3,4-dimethylaminopyridine, 2-aminopyrazine, or ammelide; a heterocyclic compound having two amino groups such as 2,6-diaminopyridine, 3,4-diaminopyridine, 3,4-bis(dimethylamino)pyridine, 2,3-diaminopyrazine, or ammeline; and a heterocyclic compound having three amino groups such as 3,4,5-aminopyridine, 4,5,6-triaminopyridine, or melamine. Among these, a pyridine derivative substituted with an amino group such as 2-aminopyridine, 4-aminopyridine, 4-dimethylaminopyridine, 4-dimethylaminomethylpyridine, 3,4-dimethylaminopyridine, 3,4-bis(dimethylamino)pyridine, 2,6 diaminopyridine, 3,4-diaminopyridine, 3,4,5-aminopyridine, or 4,5,6-triaminopyridine is preferable, and 4-aminopyridine and 3,4-diaminopyridine are even more preferable.

These respective basic compounds (b) may be used singly, or two or more kinds thereof may be used by being mixed in an arbitrary proportion.

The content of the basic compound (b) is preferably from 0.01 to 1 mol, more preferably from 0.1 to 0.7 mol, and even more preferably from 0.2 to 0.6 mol with respect to 1 mol of the conductive polymer (a) in the solution of the conductive polymer (a). The basic compound (b) efficiently interacts with the acidic group in a solution of the conductive polymer (a) when the content of the basic compound (b) is within the above range. In particular, the solvent resistance can be sufficiently improved at the time of forming an antistatic film by using the conductive composition when the content of the basic compound (b) is 0.1 mol or more. Meanwhile, the performance as an antistatic film (conductivity and the like) can be held when the content of the basic compound (b) is 0.7 mol or less.

<Water-Soluble Polymer (c)>

The water-soluble polymer (c) has a hydroxyl group.

When the water-soluble polymer (c) is used, it is considered that an ester bond is formed as the hydroxyl group in the molecule of the water-soluble polymer (c) reacts with the acidic group in the conductive polymer (a), and as a result, the conductive polymer (a) is insolubilized and the solvent resistance of the antistatic film is improved. In addition, the adhesive property thereof to a substrate is also improved.

Specific examples of the water-soluble polymer (c) may include a polyvinyl alcohol such as polyvinyl alcohol or polyvinyl formal, a water-soluble alkyd resin, a water-soluble melamine resin, a water-soluble urea resin, a water-soluble phenolic resin, a water-soluble epoxy resin, a water-soluble polybutadiene resin, a water-soluble acrylic resin, a water-soluble urethane resin, a water-soluble acrylic/styrene resin, a water-soluble acetate/acrylic copolymer resin, a water-soluble polyester resin, a water-soluble styrene/maleic acid copolymer resin, a water-soluble fluorocarbon resin, and any copolymer thereof. Among these, a polyvinyl alcohol is preferable. Incidentally, the hydroxyl group in the polyvinyl alcohol is esterified by an acetyl group in some cases. Hence, a polyvinyl alcohol having a saponification degree of 85% or more is even more preferable among the polyvinyl alcohols. Acetic acid is produced when a polyvinyl alcohol is hydrolyzed. This acetic acid migrates to the resist layer so as to deteriorate the resist layer in some cases when an antistatic film is formed as the lower layer of the resist layer by using the conductive composition. The polyvinyl alcohol is hardly hydrolyzed in the conductive composition and the production of acetic acid is suppressed when the saponification degree of the polyvinyl alcohol is 85% or more, and thus the influence of the polyvinyl alcohol on the resist layer can be decreased. The saponification degree is preferably 100% or less.

These respective water-soluble polymers (c) may be used singly, or two or more kinds thereof may be used by being mixed in an arbitrary proportion.

The polymerization degree of the water-soluble polymer (c) is preferably from 2 to 100,000, more preferably from 5 to 10,000, and even more preferably from 10 to 1000. The solubility of the water-soluble polymer (c) in a hydrophilic organic solvent (d) to be described later tends to decrease when the polymerization degree is too great.

The content of the water-soluble polymer (c) is preferably from 0.01 to 100 parts by mass and more preferably from 0.1 to 60 parts by mass with respect to 100 parts by mass of the conductive polymer (a). An effect of improving the solvent resistance and adhesive property to a substrate are sufficiently obtained when the content of the water-soluble polymer (c) is 0.01 part by mass or more. Meanwhile, the performance as an antistatic film (conductivity and the like) can be held when the content of the water-soluble polymer (c) is 100 parts by mass or less.

<Hydrophilic Organic Solvent (d)>

The hydrophilic organic solvent (d) is not particularly limited as long as it is an organic solvent which can dissolve the conductive polymer (a), the basic compound (b), and the water-soluble polymer (c) and has the effect of the invention, and examples thereof may include an alcohol such as methanol, ethanol, n-propyl alcohol, isopropyl alcohol, or butanol; a ketone such as acetone or ethyl isobutyl ketone; an ethylene glycol such as ethylene glycol or ethylene glycol methyl ether; a propylene glycol such as propylene glycol, propylene glycol methyl ether, propylene glycol ethyl ether, propylene glycol butyl ether, or propylene glycol propyl ether; an amide such as dimethylformamide or dimethylacetamide; and a pyrrolidone such as N-methylpyrrolidone or N-ethylpyrrolidone. Among these, a monohydric alcohol having from 1 to 3 carbon atoms, for example, methanol, ethanol, n-propyl alcohol, or isopropyl alcohol is more preferable and methanol, ethanol, or isopropyl alcohol is even more preferable from the viewpoint of improving the surface smoothness of the antistatic film or the laminate having the resist layer formed on the antistatic film.

These respective hydrophilic organic solvents (d) may be used singly, or two or more kinds thereof may be used by being mixed in an arbitrary proportion.

The content of the hydrophilic organic solvent (d) is preferably from 0.1 to 80% by mass and more preferably from 1 to 15% by mass with respect to the total mass of the conductive composition. In particular, the conductive polymer (a) is favorably dissolved and a coating film exhibiting excellent surface smoothness can be obtained when the content of the hydrophilic organic solvent (d) is within the above range.

<Water (e)>

The mass ratio of the water (e) to the hydrophilic organic solvent (d) in the conductive composition is water (e)/hydrophilic organic solvent (d)=preferably from 1/100 to 100/1 and more preferably from 2/100 to 100/2.

<Other Components>

The conductive composition may further contain additives within a range in which the effect of the invention is not impaired.

Examples of the additive may include additives to be used in arbitrary known paints, and examples thereof may include a pigment, a defoamer, a ultraviolet absorber, an antioxidant, a heat resistance improving agent, a leveling agent, an anti-sagging agent, a matting agent, and a preservative.

<Method for Producing Conductive Composition>

The conductive composition can be produced by mixing the conductive polymer (a), the basic compound (b), the water-soluble polymer (c), the hydrophilic organic solvent (d), and the water (e) described above together.

The temperature at the time of mixing is preferably from 0 to 100° C. and more preferably from 10 to 90° C. The conductive polymer (a), the basic compound (b), and the water-soluble polymer (c) are easily dissolved in the hydrophilic organic solvent (d) and the water (e) when the temperature at the time of mixing is within the above range. In addition, the water-soluble polymer (c) tends to easily form a microgel. The smoothness of the antistatic film tends to decrease when the microgel is formed. It is also possible to decrease the formation of microgel in the conductive composition when the temperature at the time of mixing is within the above range.

<Function and Effect>

The conductive composition of the invention described above contains the conductive polymer (a), the basic compound and (b), the water-soluble polymer (c), the hydrophilic organic solvent (d), and the water (e) described above, and thus it can be formed into an antistatic film which exhibits excellent solvent resistance and adhesive property to a substrate. The reason for that the conductive composition of the invention can be formed into an antistatic film which exhibits excellent solvent resistance and adhesive property to a substrate is considered as follows.

When the conductive polymer (a), the basic compound and (b), and the water-soluble polymer (c) are concurrently used, the acidic group in the conductive polymer (a) and the hydroxyl group in the water-soluble polymer (c) form an ester bond as well as the acidic group in the conductive polymer (a) and the base sites (nitrogen-containing heterocyclic ring and amino group) in the basic compound (b) are crosslinked, and as a result, it is considered that the solvent resistance and adhesive property to a substrate of the antistatic film are improved.

Incidentally, the hydrophilic organic solvent (d) and the water (e) plays a role to suppress the crosslinking reaction and the esterification reaction by the conductive polymer (a), the basic compound (b), and the water-soluble polymer (c) in the conductive composition. Hence, the crosslinking reaction or the esterification reaction hardly takes place in a state of the conductive composition, and a stable state can be maintained. The crosslinking reaction or the esterification reaction proceeds when the conductive composition is coated or impregnated on a substrate to be described later and the hydrophilic organic solvent (d) and the water (c) are removed therefrom through a heat treatment, and an antistatic film which exhibits excellent solvent resistance and adhesive property to a substrate is obtained.

It is preferable that the conductive composition contains a compound having a 3-amino-anisole-4-sulfonic acid unit as the conductive polymer (a), 4-aminopyridine or 3,4-diaminopyridine as the basic compound (b), a polyvinyl alcohol, particularly a polyvinyl alcohol having a saponification degree of 85% or more as the water-soluble polymers (c), a monohydric alcohol having from 1 to 3 carbon atoms, particularly methanol, ethanol, or isopropyl alcohol as the hydrophilic organic solvent (d), and the water (e).

It is preferable that the conductive composition contains the conductive polymer (a) at from 0.01 to 15% by mass and the hydrophilic organic solvent (d) at from 1 to 15% by mass with respect to the total mass of the conductive composition, the basic compound (b) at from 0.01 to 1 mol with respect to 1 mol of the conductive polymer (a), the water-soluble polymer (c) at from 0.01 to 100 parts by mass with respect to 100 parts by mass of the conductive polymer (a), and the water (e) at an amount so that water (e)/hydrophilic organic solvent (d)=from 1/100 to 100/1.

<Application>

Examples of the application of the conductive composition of the invention may include an antistatic film to be used as the lower layer film of the resist layer, a capacitor, a transparent electrode, and a semiconductor material. In particular, the conductive composition of the invention is suitably used in an antistatic film and a laminate including an antistatic film.

"Antistatic Film"

The antistatic film of the invention is formed from the conductive composition of the invention described above. Specifically, the antistatic film is obtained by coating or impregnating the conductive composition on a substrate and heating it.

The antistatic film has the maximum value of absorption in a wavelength region of from 450 to 500 nm in the ultraviolet and visible absorption spectrum at from 350 to 900 nm.

The thickness of the antistatic film is preferably from 5 to 1000 nm and more preferably from 5 to 500 nm.

The thickness of the antistatic film is one obtained by measuring the thickness at arbitrary five points by using a step meter and averaging these values.

The antistatic film of the invention exhibits excellent resistance to a solvent such as water or an alkaline solution since it is formed from the conductive composition of the invention. For example, the elution of the antistatic film into a solvent is not recognized even when it is immersed in a solvent such as water, acetone, or an aqueous solution of tetramethylammonium hydroxide for 10 minutes.

In addition, the antistatic film of the invention also exhibits excellent adhesive property to a substrate, more preferably a substrate such as a glass substrate or a tantalum substrate.

In particular, when the conductive composition contains a monohydric alcohol having from 1 to 3 carbon atoms as the hydrophilic organic solvent (d), the surface smoothness of the antistatic film is also improved, and in particular, the surface roughness (Ra) of the antistatic film is likely to be 1.5 nm or less. The surface roughness (Ra) of the antistatic film is preferably 1.0 nm or less. In addition, as one aspect of the surface roughness (Ra) of the antistatic film, the surface roughness (Ra) is 0.3 nm or more.

"Laminate"

<First Aspect>

An example of the laminate of the first aspect of the invention is illustrated in FIG. 1.

A laminate 10 of this example includes a substrate 11 and an antistatic film 12 formed on one surface of the substrate 11.

The substrate 11 is not particularly limited as long as it has the effect of the invention, but examples thereof may include molded articles of various kinds of high molecular compounds such as a polyester resin such as PET or PBT, a polyolefin resin represented by polyethylene or polypropylene, vinyl chloride, nylon, polystyrene, polycarbonate, an epoxy resin, a fluorocarbon resin, polysulfone, polyimide, polyurethane, a phenol resin, a silicone resin, and synthetic paper, a film, paper, iron, glass, quartz glass, soda lime glass, various kinds of wafers, aluminum, copper, zinc, nickel, tantalum, and stainless steel.

In addition, those obtained by forming a light shielding layer composed of a metal such as chromium on the surface of a substrate body such as glass, quartz glass, or soda lime glass may be used as a substrate. In addition, various kinds of paints or a photosensitive resin, a resist, and the like may be coated on the surface of these substrates.

The antistatic film 12 is formed from the conductive composition of the invention described above, and it has the maximum value of absorption in a wavelength region of from 450 to 500 nm in the ultraviolet and visible absorption spectrum at from 350 to 900 nm.

The thickness of the antistatic film 12 is preferably from 5 to 1000 nm and more preferably from 5 to 500 nm.

The thickness of the antistatic film 12 is one obtained by measuring the thickness at arbitrary five points by using a step meter and averaging these values.

The laminate 10 illustrated in FIG. 1 is obtained by forming the antistatic film 12 on the substrate 11 by coating or impregnating the conductive composition of the invention on one surface of the substrate 11 and then subjecting it to a heat treatment.

The method for coating or impregnating the conductive composition on a substrate is not particularly limited as long as it has the effect of the invention, but examples thereof may include techniques such as a spin coating method, a spray coating method, a dip coating method, a roll coating method, a gravure coating method, a reverse coating method, a roll brushing method, an air knife coating method, and a curtain coating method.

The step of coating or impregnating the conductive composition on the substrate may be carried out before the step of producing these substrates, for example, steps such as a uniaxial stretching method, a biaxial stretching method, molding, or embossing, it may be carried out during the step, or it may be carried out for the substrate subjected to these treatment steps.

In addition, the conductive composition of the invention exhibits favorable solvent resistance and coating property, d thus it is also possible to form a coating film by coating the conductive composition on the substrate coated with various kinds of paints or a photosensitive material or it is also possible to coat various kinds of paints or a photosensitive material on the substrate having a coating film (antistatic film) formed by coating the conductive composition.

The coating film (antistatic film) is formed by coating or impregnating the conductive composition on one surface of the substrate 11 and then removing the hydrophilic organic solvent (d) and the water (e) from the conductive composition on the substrate 11 through a heat treatment.

The temperature for the heat treatment is preferably 80° C. or higher, more preferably 100° C. or higher, even more preferably 130° C. or higher, and even more preferably 200° C. or higher. The reaction between the acidic group in the conductive polymer (a) and the hydroxyl group in the water-soluble polymer (c) is promoted as the temperature for the heat treatment increases so that an ester bond is easily formed and an insoluble coating film (antistatic film) tends to be easily formed. This provides an advantage that it is possible to apply the coating film as both of a permanent antistatic film and a temporary antistatic film for the process. In particular, the solvent resistance of the antistatic film is further improved when the temperature for the heat treatment is 130° C. or higher. The temperature for the heat treatment is preferably 400° C. or lower.

The time for the heat treatment is preferably 2 minutes or longer.

The heat treatment may be conducted in two or more stages. For example, the heat treatment may be conducted at 80° C. or higher and lower than 130° C. (first heat treatment) and then at 130° C. or higher (second heat treatment).

Incidentally, the antistatic film 12 is formed on one surface of the substrate 11 in the laminate 10 illustrated in FIG. 1, but the antistatic film 12 may also be formed on the other surface of the substrate 11.

The laminate of the first aspect of the invention exhibits excellent resistance to a solvent such as water or an alkaline solution since it includes the antistatic film formed from the conductive composition of the invention. For example, the elution of the antistatic film into a solvent is not recognized even when the laminate is immersed in a solvent such as water, acetone, or an aqueous solution of tetramethylammonium hydroxide for 10 minutes.

In addition, the laminate also exhibits excellent adhesive property to the antistatic film and a substrate, more preferably a substrate such as a glass substrate or a tantalum substrate.

In particular, when the conductive composition contains a monohydric alcohol having from 1 to 3 carbon atoms as the hydrophilic organic solvent (d), the surface smoothness of the laminate is also improved, and in particular, the surface roughness (Ra) of the outermost layer on the antistatic film side is likely to be 1.5 nm or less. The surface roughness (Ra) of the outermost layer is preferably 1.0 nm or less. In addition, as one aspect of the surface roughness (Ra) of the outermost layer, the surface roughness (Ra) is 0.3 nm or more.

The laminate of the first aspect of the invention can be used as a conductor since it includes an antistatic film. The laminate of the first aspect of the invention is suitable for the applications which require antistatic performance, for example, it is suitable for the applications such as an electronic component, an antistatic film, and fine processing using a charged particle beam.

<Second Aspect>

Figure 2:
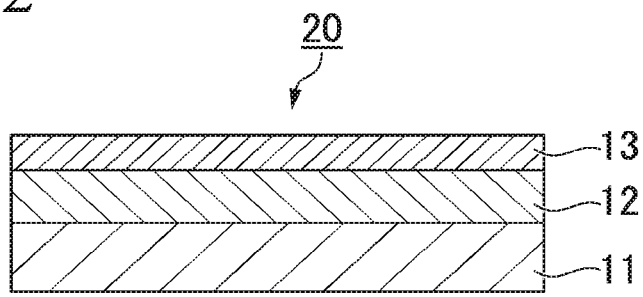
FIG. 2 is a cross-sectional diagram illustrating an example of the laminate of the second aspect of the invention.

An example of the laminate of the second aspect of the invention is illustrated in FIG. 2.

A laminate 20 of this example includes a substrate 11, an antistatic film 12 formed on at least one surface of the substrate 11, and a resist layer 13 formed on the antistatic film 12.

Incidentally, in FIG. 2 and FIGS. 3 and 4 to be described later, the same components as in FIG. 1 are denoted by the same reference numerals, and the description thereon will be omitted.

The resist constituting the resist layer 13 is not particularly limited as long as it is a compound which is sensitive to ionizing radiation, and known ones can be used, but examples thereof may include a chemically amplified resist such as a chemically amplified resist composed of a binder having a group that is decomposed by an acid generator and an acid so as to change the alkali dissolving rate of the resist, a chemically amplified resist composed of an alkali-soluble binder and a low molecular compound that is decomposed by an acid generator and an acid so as to change the alkali dissolving rate of the resist, or a chemically amplified resist composed of a binder having a group that is decomposed by an acid generator and an acid so as to change the alkali dissolving rate of the resist and a low molecular compound that is decomposed by an acid so as to change the alkali dissolving rate of the resist; and a non-chemically amplified resist such as a non-chemically amplified resist composed of a binder having a group that is decomposed by an electron beam so as to change the alkali dissolving rate of the resist or a non-chemically amplified resist composed of a binder having a moiety that is cut by an electron beam so as to change the alkali dissolving rate of the resist.

The thickness of the resist layer 13 is preferably from 10 to 10000 nm and more preferably from 10 to 5000 nm.

The thickness of the resist layer 13 is one obtained by measuring the thickness at arbitrary three points by using a step meter and averaging these values.

The resist layer 13 may be formed by a known method. For example, the resist layer 13 can be formed by coating a resist solution on the antistatic film 12 and heating (prebaking) it if necessary.

The laminate 20 of the second aspect of the invention is not limited to that illustrated in FIG. 2. For example, a conductive layer 14 may be further formed on the resist layer 13 as a laminate 30 illustrated in FIG. 3. In addition, for example, it is possible to obtain a laminate 40 which includes the substrate 11 including a substrate body 11$a$ and a light shielding layer 11$b$, the antistatic film 12 formed on the light shielding layer 11$b$ of the substrate 11, and the resist layer 13 formed on the antistatic film 12 as illustrated in FIG. 4 when those having a light shielding layer on the surface are used as the substrate.

Figure 3:
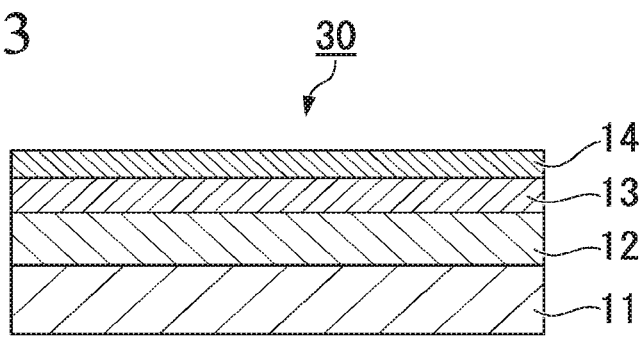
FIG. 3 is a cross-sectional diagram illustrating another example of the laminate of the second aspect of the invention.
Figure 4:
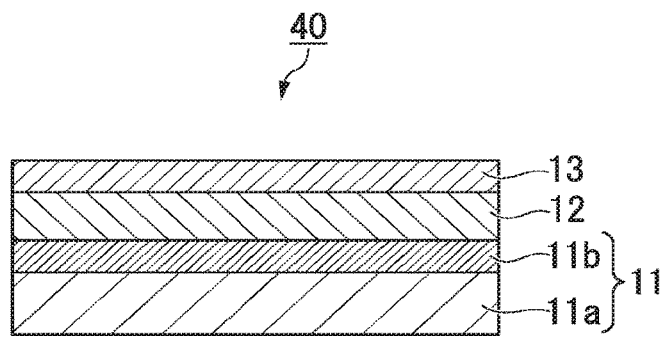
FIG. 4 is a cross-sectional diagram illustrating still another example of the laminate of the second aspect of the invention.

In addition, the antistatic film 12 is formed on one surface of the substrate 11 in the laminate 20 illustrated in FIG. 2, the laminate 30 illustrated in FIG. 3, and the laminate 40 illustrated in FIG. 4, but the antistatic film 12 may also be formed on the other surface of the substrate 11.

The material constituting the conductive layer 14 is not particularly limited, but those soluble in water, an organic solvent, and a developing solution to be described later are preferable. Examples of such a material may include a conductive polymer such as a polypyrrole derivative, a polythiophene derivative, or a polyaniline derivative; and a compound exhibiting ionic conductivity such as an ionic liquid, a cationic polymer, an anionic polymer, or a surfactant. In addition, it is also possible to use a metal such as aluminum or copper as the material constituting the conductive layer 14.

The thickness of the conductive layer 14 is preferably from 5 to 1000 nm and more preferably from 5 to 500 nm.

The thickness of the conductive layer 14 is one obtained by measuring the thickness at arbitrary three points by using a step meter and averaging these values.

The conductive layer 14 can be formed by a known method. For example, the conductive layer 14 can be formed by coating a solution of a conductive polymer or a solution of a compound exhibiting ionic conductivity on the resist layer 13 and heating (prebaking) it if necessary. In addition, the conductive layer 14 can be formed by depositing a metal constituting the conductive layer 14 on the resist layer 13 as well.

Examples of the material constituting the light shielding layer 11$b$ may include a metal such as chromium or molybdenum silicide.

The light shielding layer 11$b$ can be formed by a known method. For example, the light shielding layer 11$b$ can be formed by depositing a metal constituting the light shielding layer 11$b$ on one surface of the substrate body 11$a$.

The laminate of the second aspect of the invention exhibits excellent resistance to a solvent such as water or an alkaline solution since it includes the antistatic film formed from the conductive composition of the invention. For example, the elution of the antistatic film into a solvent is not recognized even when the laminate is immersed in a solvent such as water, acetone, or an aqueous solution of tetramethylammonium hydroxide for 10 minutes. Hence, the antistatic film is hardly eluted even when the resist solution is coated on the antistatic film. In addition, although the details will be described later, the antistatic film is hardly eluted into the developing solution even when the laminate is immersed in the developing solution upon forming a resist pattern by irradiating the resist layer with ionizing radiation and then developing it.

In addition, the laminate also exhibits excellent adhesive property to the antistatic film and a substrate, more preferably a substrate such as a glass substrate or a tantalum substrate.

In particular, when the conductive composition contains a monohydric alcohol having from 1 to 3 carbon atoms as the hydrophilic organic solvent (d), the surface smoothness of the laminate is also improved, and in particular, the surface roughness (Ra) of the outermost layer on the antistatic film side is likely to be 1.5 nm or less. The surface roughness (Ra) of the outermost layer is preferably 1.0 nm or less. In addition, as one aspect of the surface roughness (Ra) of the outermost layer, the surface roughness (Ra) is 0.3 nm or more.

In addition, the laminate of the second aspect of the invention includes an antistatic film formed from the conductive composition of the invention as the lower layer of the resist layer, and thus the antistatic film plays a role of the earth, for example, in the case of using the laminate for the production of a photomask. Specifically, it is possible to release the electrons which have passed through the resist layer by irradiation of the resist layer with ionizing radiation through the antistatic film. Hence, it is possible to suppress a decrease in accuracy of pattern drawing caused as the position of the electrons incident on the resist layer shifts by charge-up. It is also possible to prevent the electrostatic breakdown or the like of the light shielding layer by the antistatic film in a case in which the light shielding layer is formed between the substrate and the antistatic film. Meanwhile, it is possible to exert sufficient conductivity by having the antistatic film even without the light shielding layer.

However, there is a case in which the ionizing radiation bends by repulsion when the electrons accumulate on the resist layer by irradiation of the resist layer with ionizing radiation and the position of the electrons incident on the resist layer shifts. It is possible to prevent charging on the resist layer when a conductive layer is formed on the resist layer, and thus it is possible to further suppress a decrease in accuracy of pattern drawing and to more accurately form a latent image corresponding to the intended resist pattern.

Consequently, the laminate of the second aspect of the invention is suitable as a material (mask blank) for a photomask.

"Method for Producing Photomask"
<Third Aspect>

The method for producing a photomask of the third aspect of the invention includes an antistatic film forming step, a resist layer forming step, an exposure step, a development step, an etching step, and a resist removing step.

The antistatic film forming step is a step of forming an antistatic film by coating or impregnating the conductive composition of the invention described above on at least one surface of a substrate and then subjecting it to a heat treatment at 80° C. or higher.

As the substrate, various kinds of substrates previously exemplified in the description on the laminate can be used. Among these, glass, quartz glass, or the like is suitable and quartz glass or quartz glass having a light shielding layer composed of a metal such as chromium or the like formed on the surface is more preferable.

Examples of the method for coating or impregnating the conductive composition on a substrate may include the method for coating or impregnating the conductive composition on a substrate which is previously exemplified in the description on the laminate of the first aspect of the invention.

The temperature for the heat treatment is preferably 80° C. or higher, more preferably 100° C. or higher, even more preferably 130° C. or higher, and even more preferably 200° C. or higher. The temperature for the heat treatment is preferably 400° C. or lower.

In addition, in the antistatic film forming step, the heat treatment may be conducted in two or more stages after the conductive composition is coated or impregnated on at least one surface of the substrate. For example, the heat treatment may be conducted at 80° C. or higher and lower than 130° C. (first heat treatment) and then at 130° C. or higher (second heat treatment).

The resist layer forming step is a step of forming a resist layer on the antistatic film.

Examples of the resist constituting the resist layer and the method for forming a resist layer may include the resist and the method for forming a resist layer which are previously exemplified in the description on the laminate of the second aspect of the invention.

The exposure step is a step of conducting pattern drawing by irradiating the surface of the resist layer with ionizing radiation. By this, a latent image corresponding to the intended resist pattern is formed on the resist layer.

Examples of the ionizing radiation may include electron beams, X-rays, and gamma rays.

As the method for irradiation with ionizing radiation, a known method can be employed.

The development step is a step of forming a resist pattern by developing the resist layer after the patterning drawing. When the resist layer is developed, for example, the portion irradiated with ionizing radiation (exposed portion) of the resist layer can be dissolved and removed with a developing solution and a resist pattern consisting of the portion that is not irradiated with ionizing radiation (unexposed portion) of the resist layer is formed.

As the developing solution, a known developing solution to be used in the development of the resist layer may be used, but examples thereof may include an alkali developing solution such as an aqueous solution of tetramethylammonium hydroxide when the resist constituting the resist is a chemically amplified resist and an organic developing solution such as amyl acetate or methyl ethyl ketone when the resist is a non-chemically amplified resist.

After the development, a rinsing treatment may be conducted if necessary.

The etching step is a step of etching the antistatic film using the resist pattern as a mask. By etching, the antistatic film at the part that is not masked with the resist pattern (namely, exposed part) is removed.

As the method for etching, a known method can be employed, but examples thereof may include dry etching and wet etching.

The antistatic film and the light shielding layer at the part that is not masked with the resist pattern are removed by etching in the case of using one having a light shielding layer formed on the surface on the side on which the antistatic film is formed as the substrate.

The resist removing step is a step of removing the resist pattern remaining on the substrate after the etching. By removing the resist pattern, a substrate (photomask) on which the pattern is formed is obtained.

For the removal of the resist pattern, a known release agent can be used.

In the method for producing a photomask of the third aspect of the invention, the antistatic film is formed on a substrate by using the conductive composition of the invention, and thus the antistatic film is hardly eluted even when a resist solution is coated on the antistatic film or the resist layer is immersed in a developing solution when being developed.

In addition, it is possible to take the antistatic film as the earth by forming the antistatic film as the lower layer of the resist layer. Hence, it is possible to suppress a decrease in accuracy of pattern drawing caused as the position of the electrons incident on the resist layer shifts by charge-up. It is also possible to prevent the electrostatic breakdown or the like of the light shielding layer by the antistatic film in a case in which the light shielding layer is formed between the substrate and the antistatic film. Meanwhile, it is possible to exert sufficient conductivity by having the antistatic film even without the light shielding layer.

Consequently, according to the method for producing a photomask of the third aspect of the invention, it is possible to produce a photomask in which a highly accurate pattern is formed.

<Fourth Aspect>

The method for producing a photomask of the fourth aspect of the invention includes an antistatic film forming step, a resist layer forming step, a conductive layer forming step, an exposure step, a removal and development step, an etching step, and a resist removing step.

In the method for producing a photomask of the fourth aspect of the invention, the steps other than the conductive layer forming step and the removal and development step are the same as those in the method for producing a photomask of the third aspect of the invention. Incidentally, the surface of the resist layer is irradiated with ionizing radiation from the conductive layer side in the exposure step.

The conductive layer forming step is a step of forming a conductive layer on the resist layer.

Examples of the material constituting the conductive layer and the method for forming a conductive layer may include the material constituting the conductive layer and the method for forming a conductive layer which are previously exemplified in the description on the laminate of the second aspect of the invention.

The removal and development step is a step of removing the conductive layer after the pattern drawing and forming a resist pattern by developing the resist layer.

In a case in which the material constituting the conductive layer is a solution of a conductive polymer or a compound exhibiting ionic conductivity, the conductive layer can be dissolved and removed by being washed with water since these are soluble in water. To wash the conductive layer with water means to bring the conductive layer into contact with an aqueous liquid. Examples of the aqueous liquid may include water, water containing a base and/or a basic salt, water containing an acid, and a mixture of water and a water-soluble organic solvent. Meanwhile, the conductive layer can be removed by etching in a case in which the material constituting the conductive layer is a metal.

For the development of the resist layer, an operation the same as in the development step previously exemplified in the description on the method for producing a photomask of the third aspect of the invention may be conducted.

The removal and development step can be carried out, for example, by the following method (i) or (ii).

Method (i): the removal of the conductive layer and the development of the resist layer are conducted at the same time.

Method (ii): the development of the resist layer is conducted after the conductive layer is removed.

In the case of the method (i), the resist layer is developed while removing the conductive layer by using those capable of dissolving the conductive layer and the resist layer as a developing solution. Examples of such a developing solution may include an alkali developing solution such as an aqueous solution of tetramethylammonium hydroxide.

In the case of the method (ii), the resist layer is developed after the conductive layer is removed by the method described above. In the case of removing the conductive layer by water washing, the conductive layer is removed by using an aqueous solution which does not correspond to the developing solution, such as water in the water washing.

In the method for producing a photomask of the fourth aspect of the invention, the antistatic film is formed on a substrate by using the conductive composition of the invention, and thus the antistatic film is hardly eluted even when a resist solution is coated on the antistatic film or the resist layer is immersed in a developing solution when being developed.

In addition, it is possible to take the antistatic film as the earth by forming the antistatic film as the lower layer of the resist layer. Hence, it is possible to suppress a decrease in accuracy of pattern drawing caused as the position of the electrons incident on the resist layer shifts by charge-up. It is also possible to prevent the electrostatic breakdown or the like of the light shielding layer by the antistatic film in a case in which the light shielding layer is formed between the substrate and the antistatic film. Meanwhile, it is possible to exert sufficient conductivity by having the antistatic film even without the light shielding layer.

In addition, it is possible to prevent charging on the resist layer since a conductive layer is formed on the resist layer. Hence, it is possible to further suppress a decrease in accuracy of pattern drawing and to more accurately form a latent image corresponding to the intended resist pattern.

Consequently, according to the method for producing a photomask of the fourth aspect of the invention, it is possible to produce a photomask in which a highly accurate pattern is formed.

EXAMPLES

Hereinafter, the invention will be described in more detail with reference to Examples, but the following Examples are not intended to limit the scope of the invention.

Incidentally, various kinds of measurement and evaluation methods in Examples and Comparative Examples are as follows.

<Measurement and Evaluation Method>

(Measurement of Molecular Weight)

A 0.1% by mass aqueous solution of the water-soluble polymer (c) was filtered through a 0.45 µm membrane filter to conduct the sample adjustment. The sample was subjected to gel permeation chromatography (GPC) under the following conditions to measure the mass average molecular weight of the water-soluble polymer (c).

Instrument for measurement: TOSOH GPC-8020 (manufactured by Tosoh Corporation)

Eluent: 0.2M-NaNO$_3$-DIW/acetonitrile=80/20 (v/v)

Column temperature: 30° C.

Calibration curve: created by using the EasiVial™ polyethylene glycol/oxide (manufactured by Varian, Inc.)

(Evaluation on Blending Stability)

The conductive composition was visually observed and the blending stability thereof was evaluated according to the following evaluation criteria.

◯: aggregates are not recognized.

x: aggregates are recognized.

(Evaluation on Conductivity)

A conductive composition was spin-coated (2000 rpm×60 seconds) on a glass substrate and then subjected to a heat treatment for 2 minutes at 80° C. and for 30 minutes at 150° C. or for 30 minutes at 200° C. on a hot plate, thereby fabricating a conductor (laminate) in which a coating film having a thickness of about 50 nm was formed on a glass substrate.

The surface resistance value [Ω] of the conductor thus obtained was measured by a two-terminal method (interelectronic distance: 20 mm) using the resistivity meter ("Hiresta MCP-HT260" manufactured by Mitsubishi Chemical Analytech Co., Ltd.).

(Coating Film Stability Test)

A conductive composition was spin-coated (2000 rpm×60 seconds) on a glass substrate and then subjected to a heat treatment for 2 minutes at 80° C. and then for further 30 minutes at 200° C. on a hot plate, thereby fabricating a conductor (laminate) in which a coating film having a thickness of about 50 nm was formed on a glass substrate. The state of the coating film surface was visually observed and the coating film stability was evaluated according to the following evaluation criteria.

◯: cracks are not recognized.

x: cracks are recognized.

(Evaluation on Solvent Resistance)

A conductive composition was spin-coated (2000 rpm×60 seconds) on a glass substrate and then subjected to a heat treatment for 2 minutes at 80° C. and then for further 30 minutes at 200° C. on a hot plate, thereby fabricating a conductor (laminate) in which a coating film having a thickness of about 50 nm was formed on a glass substrate. Subsequently, the coating film thus obtained was immersed in the respective solvents (water, acetone, and an alkaline solution) for 10 minutes together with the glass substrate. Thereafter, the coating film was washed with water and air dried, the dissolution (elution) status of the coating film was visually observed, and the resistance (solvent resistance) of the coating film to the respective solvents was evaluated according to the following evaluation criteria. Incidentally, a 2.38% by mass aqueous solution of tetramethylammonium hydroxide (TMAH) was used as the alkaline solution.

◯: elution is not recognized.

Δ: coating film is partly eluted.

x: coating film is completely eluted.

(Evaluation on Adhesive Property to Substrate)

On the respective substrates (glass, mask blank, and tantalum), 0.1 mL of a conductive composition was dropped and then subjected to a heat treatment for 10 minutes at 200° C. in an oven, thereby obtaining a coating film. The coating film thus obtained was immersed in water for 10 minutes together with the substrate. Thereafter, the coating film was air dried, the peeling off status of the coating film was visually observed, and the adhesive property of the coating film to the respective substrates (adhesive property to substrate) was evaluated according to the following evaluation criteria. Incidentally, one obtained by forming a chromium thin film on one surface of quartz glass was used as the mask blank, and the coating film was formed by dropping a conductive composition on the chromium thin film.

◯: peeling off is not recognized.

Δ: coating film is partly peeled off x: coating film is completely peeled off.

(Evaluation on Surface Smoothness)

A conductive composition was spin-coated (2000 rpm×60 seconds) on a 4-inch silicon wafer and then subjected to a heat treatment for 30 minutes at 200° C. in an oven, thereby forming a coating film having a thickness of about 50 nm. The electron beam resist ("FEP-717" manufactured by Fujifilm Corporation) was coated on the coating film and dried, thereby fabricating a laminate in which a coating film and a resist layer were sequentially formed on a silicon wafer.

The surface roughness (Ra) on the resist layer side of the laminate thus obtained was measured by using the step and surface roughness and fine shape measuring apparatus ("Profiler P-16" manufactured by KLA-Tencor Corporation), and the surface smoothness was evaluated according to the following evaluation criteria. It means that the surface smoothness is superior as the Ra is smaller.

◯: Ra is 1.0 nm or less.

◯Δ: Ra is more than 1.0 nm and 1.5 nm or less.

x: Ra is more than 1.5 nm.

Production Example 1

(Production of Aqueous Solution (a-1) of Conductive Polymer (a))

In 300 mL of a pyridine solution (solvent: water/acetonitrile=3/7) having a concentration of 4 mol/L, 1 mol of 3-amino-anisole-4-sulfonic acid was dissolved at 0° C., thereby obtaining a monomer solution. Separately, 1 mol of ammonium peroxodisulfate was dissolved in 1 L of a water/acetonitrile=3/7 solution, thereby obtaining an oxidizing agent solution. Subsequently, the monomer solution was added dropwise to the oxidizing agent solution being cooled at 5° C. After the dropwise addition was completed, the mixture was further stirred for 12 hours at 25° C., thereby obtaining a conductive polymer. Thereafter, the reaction mixture containing the conductive polymer thus obtained was filtered by using a centrifugal filter. Furthermore, the filtered product was washed with methanol and then dried, thereby obtaining 185 g of a powdery conductive polymer (a-1-1).

In 960 g of ultrapure water, 40 g of the conductive polymer (a-1-1) thus obtained was dissolved, thereby obtaining 1000 g of an aqueous solution (a-1-2) of the conductive polymer (a) having a concentration of 4% by mass.

In a column, 500 mL of the cation exchange resin ("Amberlite IR-120B (H)" manufactured by ORGANO CORPORATION) washed with ultrapure water was packed.

Through this column, 1000 g of the aqueous solution (a-1-2) of the conductive polymer (a) passed at a rate of 50 mL/min (SV=6 [1/h]), and 900 g of an aqueous solution (a-1-3) of the conductive polymer (a) from which the basic substance and the like had been removed was obtained.

Next, 500 mL of the anion exchange resin ("Amberlite IRA410" manufactured by ORGANO CORPORATION) washed with ultrapure water was packed in a column.

Through this column, 900 g of the aqueous solution (a-1-3) of the conductive polymer (a) passed at a rate of 50 mL/min (SV=6), and 800 g of an aqueous solution (a-1) of the conductive polymer (a) from which the basic substance and the like had been removed was obtained.

This aqueous solution (a-1) of the conductive polymer (a) was subjected to the composition analysis by ion chromatography, the residual monomer was removed by 60%, the sulfate ion was removed by 99%, and the basic substance was removed by 99% or more.

Incidentally, it is defined as SV=(flow rate of liquid passing through column)/(amount of resin packed in column).

Production Example 2

(Production of Aqueous Solution (c-1) of Water-Soluble Polymer (c))

In 980 g of ultrapure water, 20 g of the polyvinyl alcohol ("EXCEVAL RS-4104" manufactured by KURARAY CO., LTD., saponification degree: 98 to 99%) was dissolved and heated and stirred for 2 hours at 95° C., thereby obtaining 1000 g of an aqueous solution (c-1) of the water-soluble polymer (c) having a concentration of 2% by mass.

Production Example 3

(Production of Aqueous Solution (c-2) of Water-Soluble Polymer (c))

In 100 mL of isopropyl alcohol of a solvent, 55 g of N-vinyl-2-pyrrolidone as a vinyl monomer, 1 g of azobisisobutyronitrile as a polymerization initiator, and 0.16 g of n-octadecyl mercaptan as a chain transfer agent for introduction of the terminal hydrophobic group were stirred and dissolved, thereby obtaining a reaction solution. Thereafter, the reaction solution was added dropwise into isopropyl alcohol which had been heated to 80° C. in advance at a dropping rate of 1 mL/min to conduct the dropping polymerization. The dropping polymerization was conducted while maintaining the temperature of isopropyl alcohol at 80° C. After the dropwise addition was completed, the resultant was aged for further 2 hours at 80° C. and then left to cool. Thereafter, the resultant was subjected to vacuum concentration, and the reaction product thus obtained was redissolved in a small amount of acetone. The acetone solution of this reaction product was added dropwise into an excessive amount of n-hexane, and a white precipitate thus obtained was filtered, washed with n-hexane, and then dried, thereby obtaining 45 g of a water-soluble polymer (c-2-1). The mass average molecular weight of the water-soluble polymer (c-2-1) thus obtained was 4800.

In 950 g of ultrapure water, 50 g of the water-soluble polymer (c-2-1) thus obtained was dissolved, thereby obtaining 1000 g of an aqueous solution (c-2) of the water-soluble polymer (c) having a concentration of 5% by mass.

Examples 1 to 20 and Comparative Examples 1 to 10

An aqueous solution of the conductive polymer (a), a solution of the basic compound (b), an aqueous solution of the water-soluble polymer (c), the hydrophilic organic solvent (d), and the water (e) were mixed together at 25° C. in the blending composition presented in Tables 1 to 3, thereby preparing a conductive composition. Incidentally, the amount (parts by mass) of water (e) in Tables 1 to 3 does not include the amount of water in the aqueous solution of the conductive polymer (a), the solution of the basic compound (b), and the aqueous solution of the water-soluble polymer (c).

By using the conductive composition thus obtained, the blending stability, the conductivity, the coating stability, the solvent resistance, the adhesive property to a substrate, and the surface smoothness were evaluated. The results thereof are presented in Tables 1 to 3.

Figure 5:
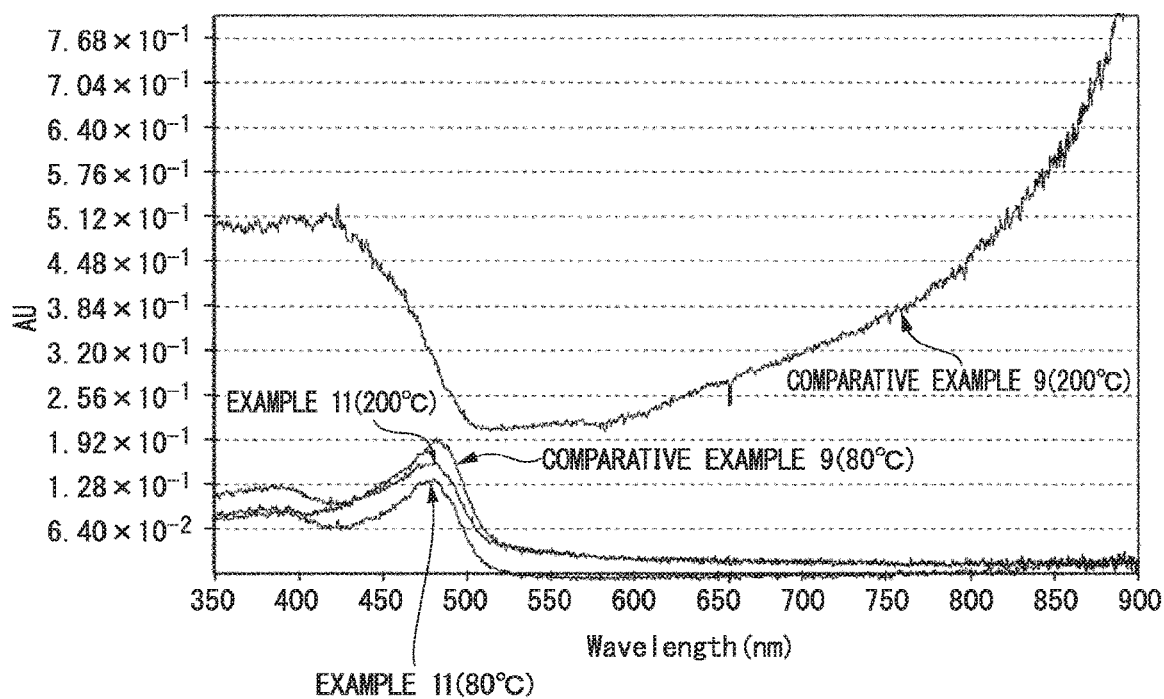
FIG. 5 is ultraviolet and visible absorption spectra of conductive compositions obtained in Example 11 and Comparative Example 9.

In addition, for Example 11 and Comparative Example 9, the ultraviolet and visible absorption spectrum was measured for each of the coating film after subjected to a heat treatment for 2 minutes at 80° C. and the coating film after further subjected to a heat treatment for 30 minutes at 200° C. thereafter in the evaluation on solvent resistance. The results thereof are illustrated in FIG. 5. In addition, the solvent resistance was also evaluated for a conductor (laminate) after subjected to a heat treatment for 2 minutes at 80° C. The results thereof are presented in Table 4.

TABLE 1

| | | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Aqueous solution of conductive polymer (a) [parts by mass] | a-1 | 10 | 10 | 10 | 10 | 10 | 10 | 10 | 10 | 10 | 10 |
| Solution of basic compound (b) [parts by mass] | b-1 | 1.1 | 1.7 | 2.3 | 2.6 | 0 | 0 | 1.1 | 0.6 | 0 | 0 |
| | b-2 | 0 | 0 | 0 | 0 | 1.6 | 2.4 | 0 | 0 | 1.6 | 0.8 |
| Aqueous solution of water-soluble polymer (c) [parts by mass] | c-1 | 9.7 | 10.3 | 11 | 11.5 | 9.5 | 10.1 | 2.5 | 2.3 | 2.5 | 2.3 |
| Hydrophilic organic solvent (d) [parts by mass] | d-1 | 1.4 | 1.5 | 1.6 | 1.7 | 1.8 | 1.3 | 1.1 | 1 | 1.1 | 1.7 |
| Water (e) [parts by mass] | | 1 | 1.3 | 1.6 | 1.8 | 0 | 0.4 | 3.3 | 2.9 | 2.6 | 1.8 |
| Proportion of (d) to total mass of conductive composition [% by mass] | | 6 | 6 | 6 | 6 | 8 | 5 | 6 | 6 | 6 | 10 |
| Proportion of (b) to 1 mol of (a) [mol] | | 0.30 | 0.46 | 0.62 | 0.70 | 0.33 | 0.50 | 0.30 | 0.16 | 0.33 | 0.17 |
| Proportion of (c) to 100 parts by mass of (a) [parts by mass] | | 49 | 52 | 55 | 58 | 48 | 51 | 13 | 12 | 13 | 12 |
| Blending stability | | ○ | ○ | ○ | ○ | ○ | ○ | ○ | ○ | ○ | ○ |
| Conductivity (surface | 80° C. | $1.3 \times 10^7$ | $1.6 \times 10^7$ | $2.1 \times 10^7$ | $8.9 \times 10^7$ | $8.8 \times 10^6$ | $9.4 \times 10^6$ | $5.0 \times 10^6$ | $4.3 \times 10^6$ | $1.8 \times 10^6$ | $5.1 \times 10^6$ |
| | 150° C. | $3.5 \times 10^7$ | $4.3 \times 10^7$ | $6.4 \times 10^7$ | $1.1 \times 10^8$ | $9.7 \times 10^6$ | $1.1 \times 10^7$ | $9.0 \times 10^6$ | $6.1 \times 10^6$ | $5.6 \times 10^6$ | $4.2 \times 10^6$ |

TABLE 1-continued

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| resistance value [Ω]) | 200° C. | $6.2 \times 10^8$ | $1.7 \times 10^8$ | $9.6 \times 10^8$ | $4.9 \times 10^8$ | $1.3 \times 10^8$ | $8.1 \times 10^7$ | $8.7 \times 10^7$ | $6.6 \times 10^7$ | $5.1 \times 10^7$ | $7.4 \times 10^7$ |
| Coating stability |  | ○ | ○ | ○ | ○ | ○ | ○ | ○ | ○ | ○ | ○ |
| Solvent resistance | Water | ○ | ○ | ○ | ○ | ○ | ○ | ○ | ○ | ○ | ○ |
|  | Acetone | ○ | ○ | ○ | ○ | ○ | ○ | ○ | ○ | ○ | ○ |
|  | TMAH | ○ | ○ | ○ | ○ | ○ | ○ | ○ | ○ | ○ | ○ |
| Adhesive property | Glass | ○ | ○ | ○ | ○ | ○ | ○ | ○ | ○ | ○ | ○ |
| to substrate | Blank | ○ | ○ | ○ | ○ | ○ | ○ | ○ | ○ | ○ | ○ |
|  | Ta plate | ○ | ○ | ○ | ○ | ○ | ○ | ○ | ○ | ○ | ○ |
| Surface smoothness |  | ○ | ○ | ○ | ○ | ○ | ○ | ○ | ○ | ○ | ○ |

TABLE 2

|  |  | Example 11 | Example 12 | Example 13 | Example 14 | Example 15 | Example 16 | Example 17 | Example 18 | Example 19 | Example 20 |
|---|---|---|---|---|---|---|---|---|---|---|---|
| Aqueous solution of conductive polymer (a) [parts by mass] | a-1 | 10 | 10 | 10 | 10 | 10 | 10 | 10 | 10 | 10 | 10 |
| Solution of basic compound (b) [parts by mass] | b-1 | 1.7 | 1.7 | 1.7 | 1.7 | 1.7 | 1.7 | 1.7 | 1.7 | 1.7 | 1.7 |
| Aqueous solution of water-soluble polymer (c) [parts by mass] | c-1 | 10.9 | 10.9 | 10.9 | 10.9 | 10.9 | 10.9 | 10.9 | 10.9 | 10.9 | 10.9 |
| Hydrophilic organic solvent (d) [parts by mass] | d-1 | 1.3 | 0 | 0 | 0 | 0 | 0 | 0 | 0 | 0.4 | 6 |
|  | d-2 | 0 | 1.3 | 0 | 0 | 0 | 0 | 0 | 0 | 0 | 0 |
|  | d-3 | 0 | 0 | 1.3 | 0 | 0 | 0 | 0 | 0 | 0 | 0 |
|  | d-4 | 0 | 0 | 0 | 1.3 | 0 | 0 | 0 | 0 | 0 | 0 |
|  | d-5 | 0 | 0 | 0 | 0 | 1.3 | 0 | 0 | 0 | 0 | 0 |
|  | d-6 | 0 | 0 | 0 | 0 | 0 | 1.3 | 0 | 0 | 0 | 0 |
|  | d-7 | 0 | 0 | 0 | 0 | 0 | 0 | 1.3 | 0 | 0 | 0 |
|  | d-8 | 0 | 0 | 0 | 0 | 0 | 0 | 0 | 1.3 | 0 | 0 |
| Water (e) [parts by mass] |  | 10 | 10 | 10 | 10 | 10 | 10 | 10 | 10 | 10 | 10 |
| Proportion of (d) to total mass of conductive composition [% by mass] |  | 4 | 4 | 4 | 4 | 4 | 4 | 4 | 4 | 1 | 16 |
| Proportion of (b) to 1 mol of (a) [mol] |  | 0.46 | 0.46 | 0.46 | 0.46 | 0.46 | 0.46 | 0.46 | 0.46 | 0.46 | 0.46 |
| Proportion of (c) to 100 parts by mass of (a) [parts by mass] |  | 55 | 55 | 55 | 55 | 55 | 55 | 55 | 55 | 55 | 55 |
| Blending stability |  | ○ | ○ | ○ | ○ | ○ | ○ | ○ | ○ | ○ | ○ |
| Conductivity (surface resistance value [Ω]) | 80° C. | $1.8 \times 10^7$ | $1.6 \times 10^7$ | $1.6 \times 10^7$ | $5.0 \times 10^7$ | $8.0 \times 10^7$ | $7.0 \times 10^7$ | $6.0 \times 10^7$ | $6.0 \times 10^7$ | $1.0 \times 10^7$ | $1.0 \times 10^7$ |
|  | 150° C. | $4.5 \times 10^7$ | $4.4 \times 10^7$ | $4.3 \times 10^7$ | $1.0 \times 10^8$ | $3.0 \times 10^8$ | $2.0 \times 10^8$ | $2.0 \times 10^8$ | $2.0 \times 10^8$ | $2.0 \times 10^7$ | $2.0 \times 10^7$ |
|  | 200° C. | $1.9 \times 10^8$ | $1.7 \times 10^8$ | $1.9 \times 10^8$ | $6.0 \times 10^8$ | $8.0 \times 10^8$ | $7.0 \times 10^8$ | $7.0 \times 10^8$ | $7.0 \times 10^8$ | $4.0 \times 10^7$ | $4.0 \times 10^7$ |
| Coating stability |  | ○ | ○ | ○ | ○ | ○ | ○ | ○ | ○ | ○ | ○ |
| Solvent resistance | Water | ○ | ○ | ○ | ○ | ○ | ○ | ○ | ○ | ○ | ○ |
|  | Acetone | ○ | ○ | ○ | ○ | ○ | ○ | ○ | ○ | ○ | ○ |
|  | TMAH | ○ | ○ | ○ | ○ | ○ | ○ | ○ | ○ | ○ | ○ |
| Adhesive property to substrate | Glass | ○ | ○ | ○ | ○ | ○ | ○ | ○ | ○ | ○ | ○ |
|  | Blank | ○ | ○ | ○ | ○ | ○ | ○ | ○ | ○ | ○ | ○ |
|  | Ta plate | ○ | ○ | ○ | ○ | ○ | ○ | ○ | ○ | ○ | ○ |
| Surface smoothness |  | ○ | ○ | ○ | ○△ | ○△ | ○△ | ○△ | ○△ | ○ | ○△ |

TABLE 3

|  |  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 |
|---|---|---|---|---|---|---|---|---|---|---|---|
| Aqueous solution of conductive polymer (a) [parts by mass] | a-1 | 10 | 10 | 10 | 10 | 10 | 10 | 10 | 10 | 10 | 10 |
| Solution of basic compound (b) [parts by mass] | b-1 | 0 | 0 | 0 | 0 | 0 | 1.1 | 1.1 | 1.1 | 0 | 0 |
|  | b-3 | 1.1 | 0 | 0 | 0 | 0 | 0 | 0 | 0 | 0 | 0 |
|  | b-4 | 0 | 0.9 | 0 | 0 | 0 | 0 | 0 | 0 | 0 | 0 |
|  | b-5 | 0 | 0 | 3 | 0 | 0 | 0 | 0 | 0 | 0 | 0 |
|  | b-6 | 0 | 0 | 0 | 1.3 | 0 | 0 | 0 | 0 | 0 | 0 |
|  | b-7 | 0 | 0 | 0 | 0 | 0 | 0 | 0 | 0 | 0 | 1.7 |
| Aqueous solution of water-soluble polymer (c) [parts by mass] | c-1 | 9.5 | 9.3 | 11.5 | 9.8 | 9.3 | 9.7 | 0 | 0 | 0 | 10.9 |
|  | c-2 | 0 | 0 | 0 | 0 | 0 | 0 | 0 | 3.9 | 0 | 0 |
| Hydrophilic organic solvent (d) [parts by mass] | d-1 | 1.4 | 1.3 | 1.7 | 1.4 | 1.2 | 0 | 1 | 1.4 | 0.8 | 0 |
|  | d-2 | 0 | 0 | 0 | 0 | 0 | 0 | 0 | 0 | 0 | 1.3 |
| Water (e) [parts by mass] |  | 0.9 | 0.9 | 1.8 | 1.1 | 0.5 | 2.4 | 4.1 | 6.8 | 3.2 | 10 |
| Proportion of (d) to total mass of conductive composition [% by mass] |  | 6 | 6 | 6 | 6 | 6 | 0 | 6 | 6 | 6 | 4 |
| Proportion of (b) to 1 mol of (a) [mol] |  | 0.31 | 0.29 | 0.29 | 0.27 | 0 | 0.30 | 0.30 | 0.30 | 0 | 0.37 |
| Proportion of (c) to 100 parts by mass of (a) [parts by mass] |  | 48 | 47 | 58 | 49 | 47 | 49 | 0 | 49 | 0 | 55 |
| Blending stability |  | ○ | ○ | ○ | ○ | ○ | X | ○ | ○ | ○ | X |
| Conductivity (surface resistance value [Ω]) | 80° C. | $6.6 \times 10^7$ | $2.7 \times 10^7$ | $4.1 \times 10^8$ | $6.5 \times 10^7$ | $1.6 \times 10^7$ | — | $1.6 \times 10^6$ | $1.2 \times 10^7$ | $1.0 \times 10^6$ | — |
|  | 150° C. | $2.6 \times 10^8$ | $4.7 \times 10^7$ | $2.1 \times 10^8$ | $1.5 \times 10^8$ | $3.3 \times 10^7$ | — | $1.7 \times 10^6$ | $2.3 \times 10^7$ | $9.0 \times 10^5$ | — |
|  | 200° C. | $9.4 \times 10^9$ | $9.4 \times 10^9$ | $3.7 \times 10^{11}$ | $5.6 \times 10^{10}$ | $2.3 \times 10^{10}$ | — | $6.6 \times 10^6$ | $6.9 \times 10^7$ | $9.0 \times 10^{11}$ | — |
| Coating stability |  | ○ | ○ | ○ | ○ | ○ | — | X | X | X | — |
| Solvent resistance | Water | X | X | X | X | X | — | X | X | ○ | — |
|  | Acetone | ○ | ○ | ○ | ○ | ○ | — | ○ | ○ | ○ | — |
|  | TMAH | X | X | X | X | X | — | X | X | Δ | — |
| Adhesive property to substrate | Glass | Δ | Δ | Δ | Δ | Δ | — | ○ | X | X | — |
|  | Blank | Δ | Δ | Δ | Δ | Δ | — | ○ | X | X | — |
|  | Ta plate | Δ | Δ | Δ | Δ | Δ | — | ○ | X | X | — |
| Surface smoothness |  | ○ | ○ | ○ | ○ | ○ | — | X | ○ | ○ | — |

TABLE 4

|  |  | Example 11 | | Comparative Example 9 | |
|---|---|---|---|---|---|
|  |  | 80° C. | 200° C. | 80° C. | 200° C. |
| Solvent resistance | Water | Δ | ○ | x | ○ |
|  | Acetone | Δ | ○ | Δ | ○ |
|  | TMAH | Δ | ○ | x | Δ |

Incidentally, the abbreviations in Tables 1 to 3 are as follows.

b-1: 5% by mass aqueous solution of 4-aminopyridine,
b-2: 3% by mass isopropyl alcohol solution of 3,4-diaminopyridine,
b-3: 5% by mass aqueous solution of tetraethylammonium hydroxide,
b-4: 5% by mass aqueous solution of pyridine,
b-5: 5% by mass aqueous solution of tetrabutylammonium hydroxide,
b-6: 5% by mass aqueous solution of tris(hydroxymethyl)aminomethane,
b-7: 5% by mass aqueous solution of diaminohexane,
d-1: isopropyl alcohol,
d-2: methanol,
d-3: ethanol,
d-4: butanol,
d-5: acetone,
d-6: glycerin,
d-7: diethylene glycol,
d-8: propylene glycol monomethyl ether acetate, Blank: mask blank obtained by forming chromium thin film on quartz glass, and Ta plate: tantalum plate having purity of 99.95%.

As apparent from Tables 1 to 3, the conductive compositions obtained in the respective Examples exhibited excellent solvent resistance and adhesive property to a substrate and also favorable blending stability, conductivity, and coating stability. In particular, laminates which also exhibited excellent surface smoothness were obtained from the conductive compositions of Examples 1 to 13 and 19 containing a monohydric alcohol having from 1 to 3 carbon atoms at from 1 to 15% by mass as the hydrophilic organic solvent (d).

In contrast, the conductive compositions of Comparative Examples 1 to 4 using solutions (b-3 to b-6) of a basic compound which did not have at least one nitrogen-containing heterocyclic ring and one amino group exhibited poor resistance to water and an alkaline solution and also poor adhesive property to various kinds of substrates.

The conductive composition of Comparative Example 5 in which a solution of the basic compound (b) was not used exhibited poor resistance to water and an alkaline solution and also poor adhesive property to various kinds of substrates.

In the conductive composition of Comparative Example 6 in which the hydrophilic organic solvent (d) was not used, aggregations were precipitated immediately after blending, and thus it was not possible to form a coating film.

The conductive composition of Comparative Example 7 in which an aqueous solution of the water-soluble polymer (c) was not used had a rough film surface after the heat treatment and exhibited poor resistance to water and an alkaline solution. In addition, it exhibited poor surface smoothness as well.

The conductive composition of Comparative Example 8 in which an aqueous solution (c-2) of a water-soluble polymer which does not have a hydroxyl group was used had a rough film surface after the heat treatment and exhibited poor resistance to water and an alkaline solution. In addition, it exhibited poor adhesive property to various kinds of substrates as well.

The conductive composition of Comparative Example 9 in which a solution of the basic compound (b) and an aqueous solution of the water-soluble polymer (c) were not used had a rough film surface after the heat treatment. In addition, it exhibited poor adhesive property to various kinds of substrates as well.

In the conductive composition of Comparative Example 10 using a 5% by mass aqueous solution (b-7) of diaminohexane, aggregations were precipitated immediately after blending, and thus it was not possible to form a coating film.

In addition, as apparent from FIG. 5, the coating film (antistatic film) formed from the conductive composition of Example 11 had the maximum value of absorption in a wavelength region of from 450 to 500 nm in the ultraviolet and visible absorption spectrum at from 350 to 900 nm in both cases in which the temperature for the heat treatment was 80° C. and 200° C. In addition, as apparent from Table 4, superior solvent resistance was exhibited in a case in which the temperature for the heat treatment was 200° C. as compared to a case in which it was 80° C.

On the other hand, the coating film formed from the conductive composition of Comparative Example 9 had the maximum value of absorption in a wavelength region of from 450 to 500 nm in the ultraviolet and visible absorption spectrum at from 350 to 900 nm in a case in which the temperature for the heat treatment was 80° C., but the maximum value of absorption disappeared when the temperature for the heat treatment was raised to 200° C. In addition, poor resistance to water and an alkaline solution was exhibited in a case in which the temperature for the heat treatment was 80° C.

INDUSTRIAL APPLICABILITY

The conductive composition of the invention can be formed into an antistatic film exhibiting excellent solvent resistance and adhesive property to a substrate.

EXPLANATIONS OF LETTERS OR NUMERALS

10 Laminate
11 Substrate
11a Substrate body
11b Light shielding layer
12 Antistatic film
13 Resist layer
14 Conductive layer
20 Laminate
30 Laminate
40 Laminate

The invention claimed is:

1. A conductive composition, comprising:
   a conductive polymer (a) having a sulfonic acid group and/or a carboxyl group;
   a basic compound (b) having at least one nitrogen-containing heterocyclic ring and one amino group;
   a water-soluble polymer (c) having a hydroxyl group, with the proviso that the conductive polymer (a) is excluded;
   a hydrophilic organic solvent (d); and
   water (e).

2. The conductive composition according to claim 1, wherein the basic compound (b) has a conjugated structure.

3. The conductive composition according to claim 1, wherein the nitrogen-containing heterocyclic ring is a pyridine ring.

4. The conductive composition according to claim 1, wherein the water-soluble polymer (c) is polyvinyl alcohol.

5. The conductive composition according to claim 4, wherein a saponification degree of the polyvinyl alcohol is 85% or more.

6. The conductive composition according to claim 1, wherein the hydrophilic organic solvent (d) is a monohydric alcohol having from 1 to 3 carbon atoms.

7. The conductive composition according to claim 1, wherein a content of the hydrophilic organic solvent (d) is from 1 to 15% by mass with respect to a total mass of the conductive composition.

8. The conductive composition according to claim 1, wherein the conductive polymer (a) has a unit of formula (1):

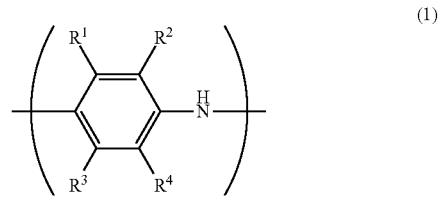

wherein in the formula (1),
$R^1$ to $R^4$ each independently represent a hydrogen atom, a linear or branched alkyl group having from 1 to 24 carbon atoms, a linear or branched alkoxy group having from 1 to 24 carbon atoms, an acidic group, a hydroxyl group, a nitro group, or a halogen atom, and
at least one of $R^1$ to $R^4$ is an acidic group, wherein the acidic group is a sulfonic acid group or a carboxyl group.

9. An antistatic film comprising the conductive composition according to claim 1, wherein
the antistatic film has a maximum value of absorption in a wavelength region of from 450 to 500 nm in the ultraviolet and visible absorption spectrum at from 350 to 900 nm.

10. A laminate comprising:
a substrate; and
an antistatic film formed on at least one surface of the substrate, the antistatic film comprising the conductive composition according to claim 1, wherein
the antistatic film has a maximum value of absorption in a wavelength region of from 450 to 500 nm in the ultraviolet and visible absorption spectrum at from 350 to 900 nm.

11. The laminate according to claim 10, further comprising a resist layer on the antistatic film.

12. The laminate according to claim 11, further comprising a conductive layer on the resist layer.

13. The laminate according to claim 10, wherein a surface roughness (Ra) of an outermost layer on the antistatic film side is 1.5 nm or less.

14. A method for producing a laminate, the method comprising:
forming an antistatic film by coating or impregnating the conductive composition according to claim 1 on at least one surface of a substrate; and then
subjecting the conductive composition to a heat treatment at 80° C. or higher.

15. The production method according to claim 14, further comprising forming a resist layer on the antistatic film.

16. The production method according to claim 15, further comprising forming a conductive layer on the resist layer.

17. A method for producing a photomask, the method comprising:
forming an antistatic film by coating or impregnating the conductive composition according to claim 1 on at least one surface of a substrate and then subjecting the conductive composition to a heat treatment at 80° C. or higher;
forming a resist layer on the antistatic film;
performing pattern drawing by irradiating a surface of the resist layer with ionizing radiation;
forming a resist pattern by developing the resist layer after pattern drawing;
etching the antistatic film by using the resist pattern as a mask; and
removing the resist pattern remaining on the substrate after etching.

18. A method for producing a photomask, the method comprising:
forming an antistatic film by coating or impregnating the conductive composition according to claim 1 on at least one surface of a substrate and then subjecting the conductive composition to a heat treatment at 80° C. or higher;
forming a resist layer on the antistatic film;
forming a conductive layer on the resist layer;
performing pattern drawing by irradiating a surface of the resist layer with ionizing radiation from a conductive layer side;
forming a resist pattern by removing the conductive layer and developing the resist layer after pattern drawing;
etching the antistatic film by using the resist pattern as a mask; and
removing the resist pattern remaining on the substrate after etching.

19. The production method according to claim 17, wherein the substrate has a light shielding layer on a side of an interface between the substrate and the antistatic film and the etching further comprises etching the light shielding layer.

* * * * *